(12) United States Patent
Kobayashi

(10) Patent No.: US 9,456,504 B2
(45) Date of Patent: Sep. 27, 2016

(54) ELECTRONIC DEVICE

(71) Applicant: Shinko Electric Industries Co., Ltd., Nagano-ken (JP)

(72) Inventor: Tomoki Kobayashi, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 93 days.

(21) Appl. No.: 14/547,498

(22) Filed: Nov. 19, 2014

(65) Prior Publication Data

US 2015/0156864 A1  Jun. 4, 2015

(30) Foreign Application Priority Data

Dec. 3, 2013  (JP) .................................. 2013-250145

(51) Int. Cl.
| | |
|---|---|
| H05K 3/28 | (2006.01) |
| H05K 1/02 | (2006.01) |
| H05K 1/18 | (2006.01) |
| H05K 3/36 | (2006.01) |

(52) U.S. Cl.
CPC ............ *H05K 3/284* (2013.01); *H05K 1/0218* (2013.01); *H05K 1/186* (2013.01); *H05K 3/368* (2013.01); *H05K 2201/042* (2013.01); *H05K 2201/0715* (2013.01); *H05K 2201/086* (2013.01); *H05K 2201/10234* (2013.01)

(58) Field of Classification Search
CPC ........... H05K 1/186; H05K 2201/041; H05K 3/284; H05K 3/368
See application file for complete search history.

(56) References Cited

U.S. PATENT DOCUMENTS

| | | | | |
|---|---|---|---|---|
| 2006/0249824 A1* | 11/2006 | Lee | .......................... | H01L 24/97 257/678 |
| 2011/0248389 A1* | 10/2011 | Yorita | .................. | H01L 23/3677 257/659 |
| 2014/0063768 A1* | 3/2014 | Tanaka | ................ | H01L 23/3121 361/784 |

FOREIGN PATENT DOCUMENTS

| | | |
|---|---|---|
| JP | 2011-124366 | 6/2011 |
| WO | WO 2005 081609 | 9/2005 |

OTHER PUBLICATIONS

Wikipedia defintion of "Magnet".*

* cited by examiner

*Primary Examiner* — Steven T Sawyer
*Assistant Examiner* — Ahmad D Barnes
(74) *Attorney, Agent, or Firm* — Fish & Richardson P.C.

(57) ABSTRACT

An electronic device includes wiring substrates stacked upon one another with a connection member arranged between adjacent wiring substrates, in which the connection member electrically connects the adjacent wiring substrates, and each wiring substrate includes a solder resist layer as a lowermost layer, electronic components mounted on the wiring substrates so that at least one of the electronic components is mounted on each wiring substrate, a first magnetic thin film covering a lower surface of the solder resist layer of an upper one of the adjacent wiring substrates, a first encapsulation resin formed on an upper surface of the uppermost wiring substrate and encapsulates the electronic component mounted on the uppermost wiring substrate, and a second magnetic thin film that entirely covers an upper surface of the first encapsulation resin and covers a lower surface of the solder resist layer on the lowermost wiring substrates.

8 Claims, 16 Drawing Sheets

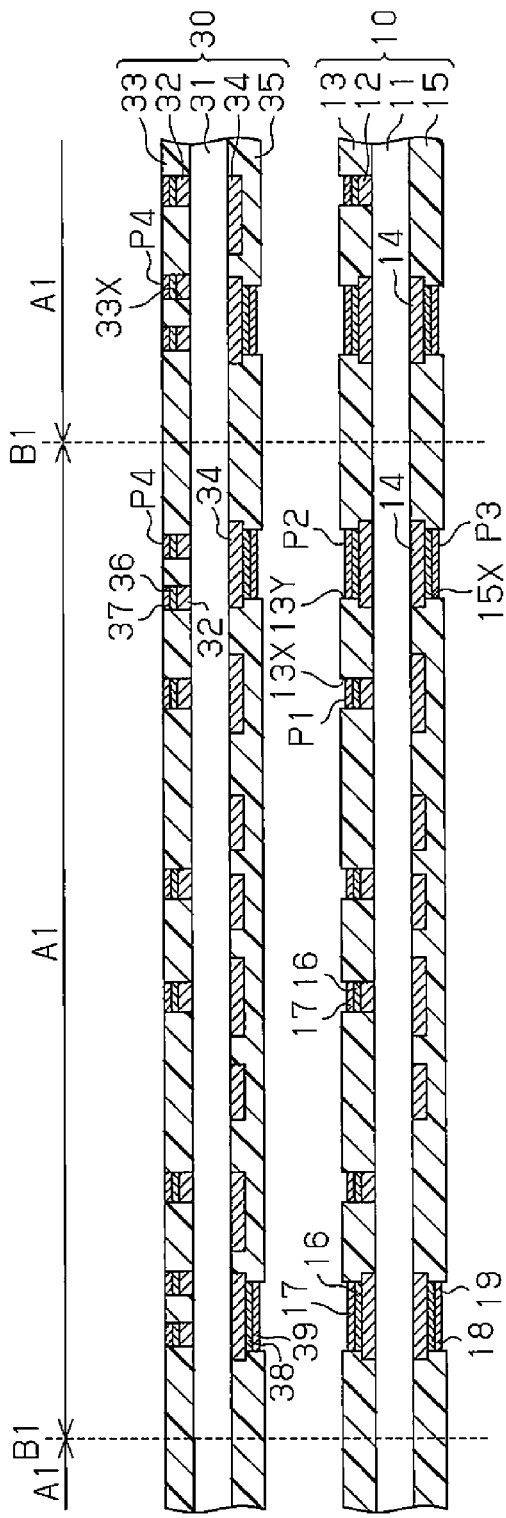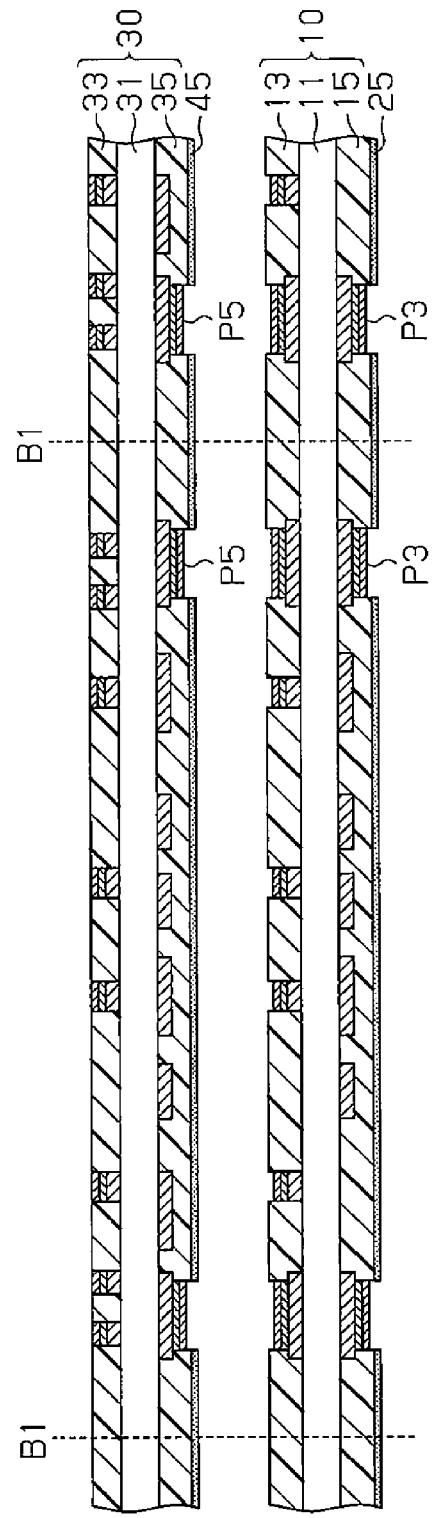

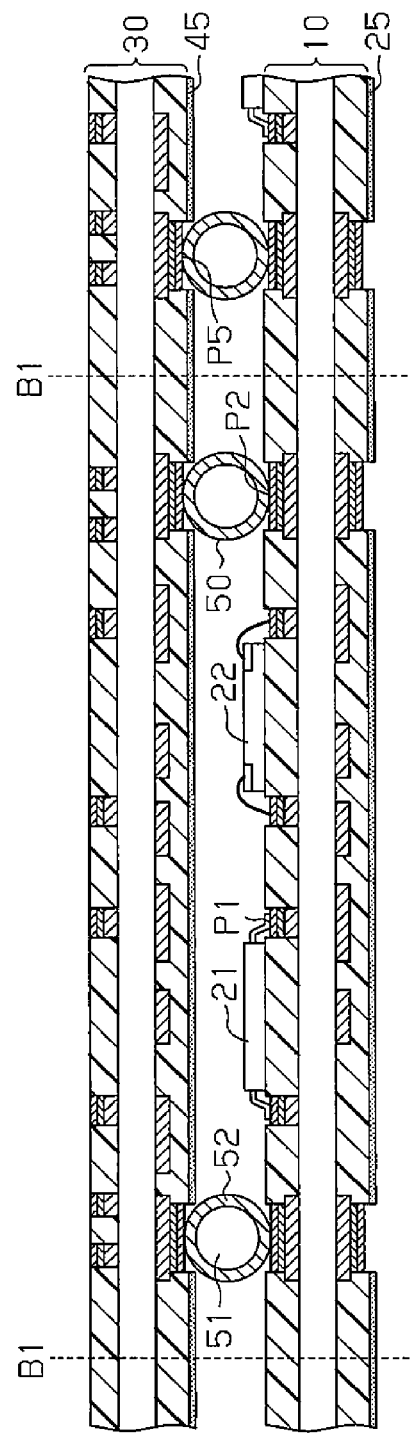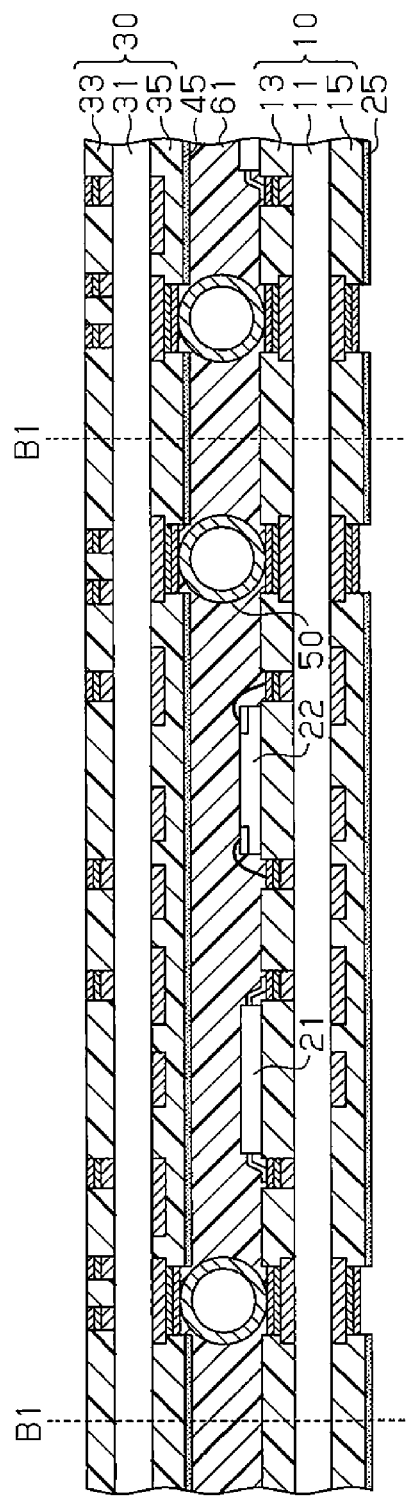

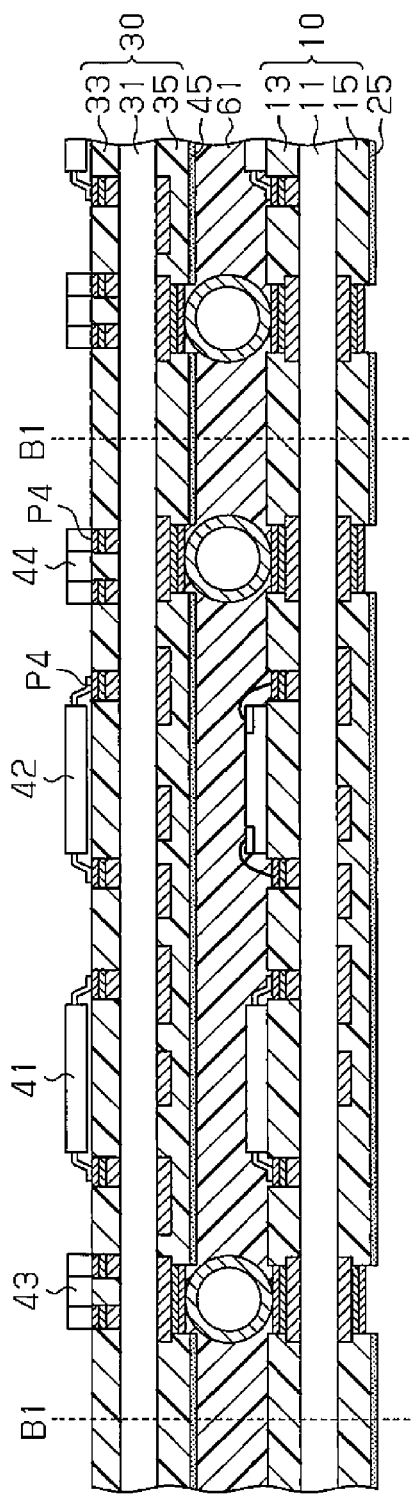
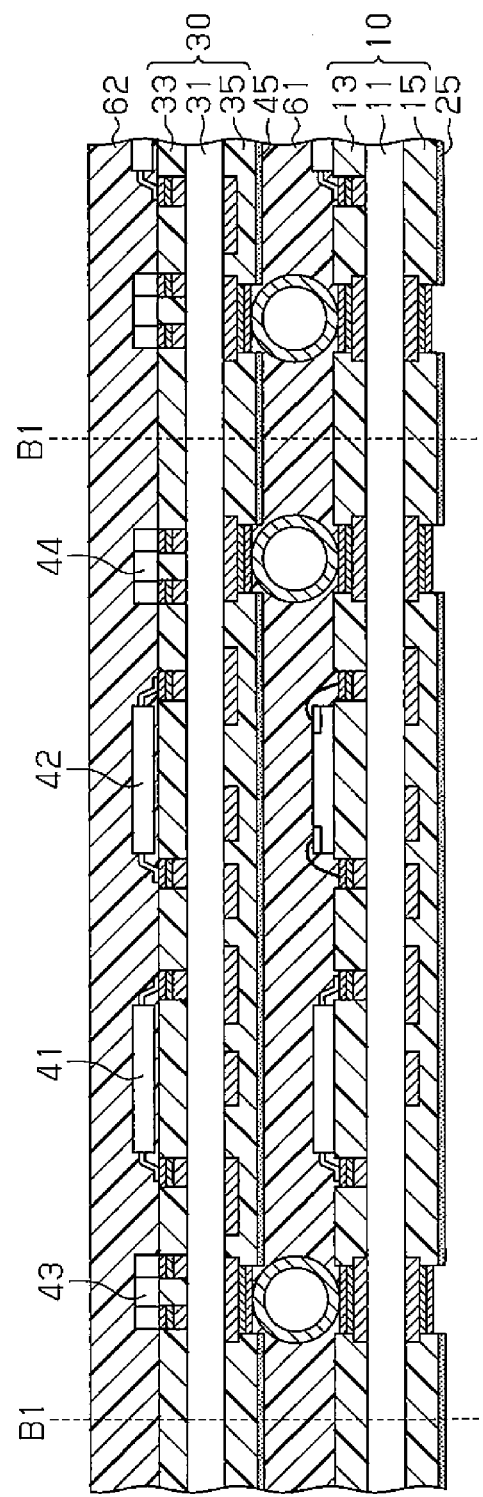
Fig.5A
Fig.5B

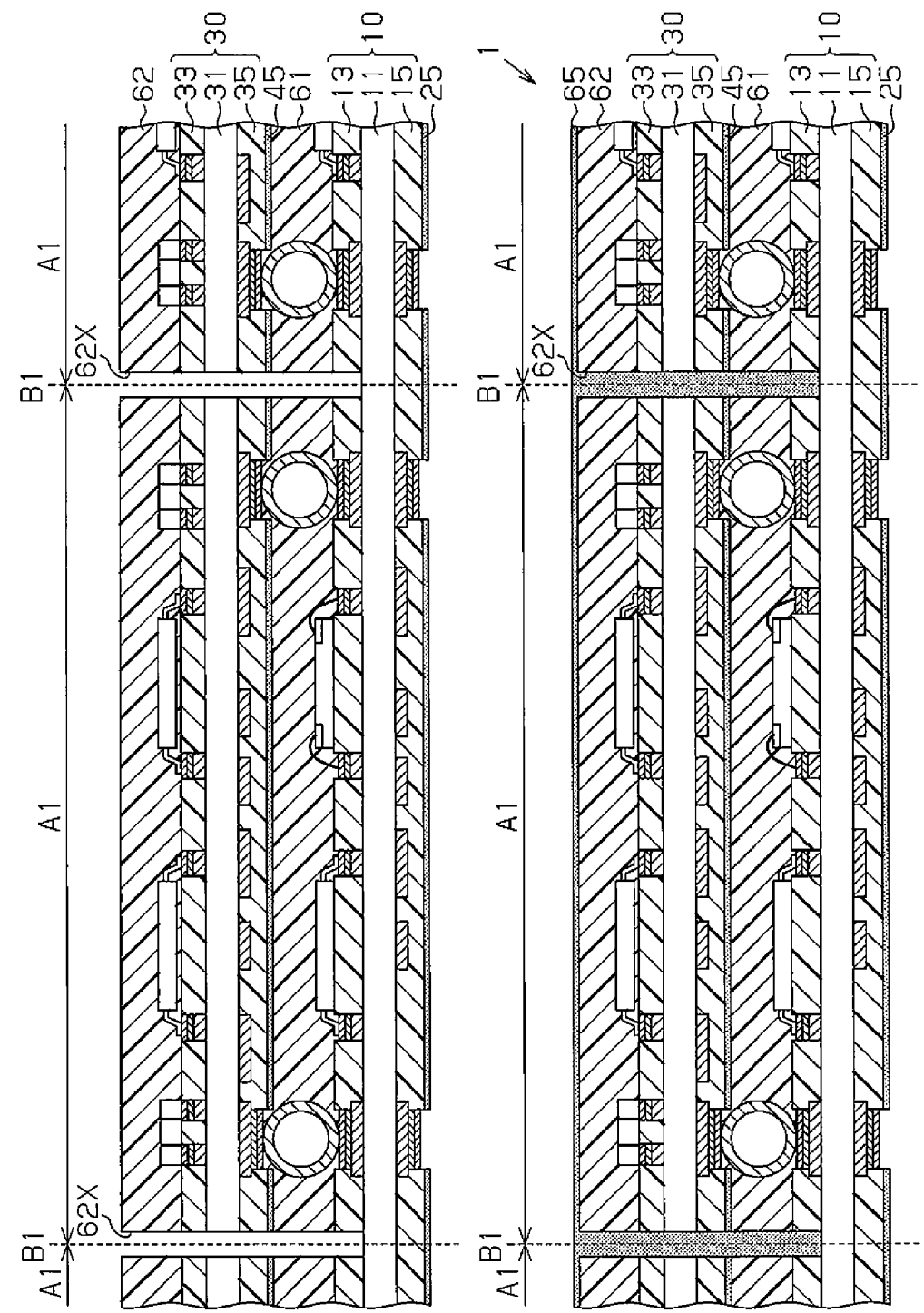

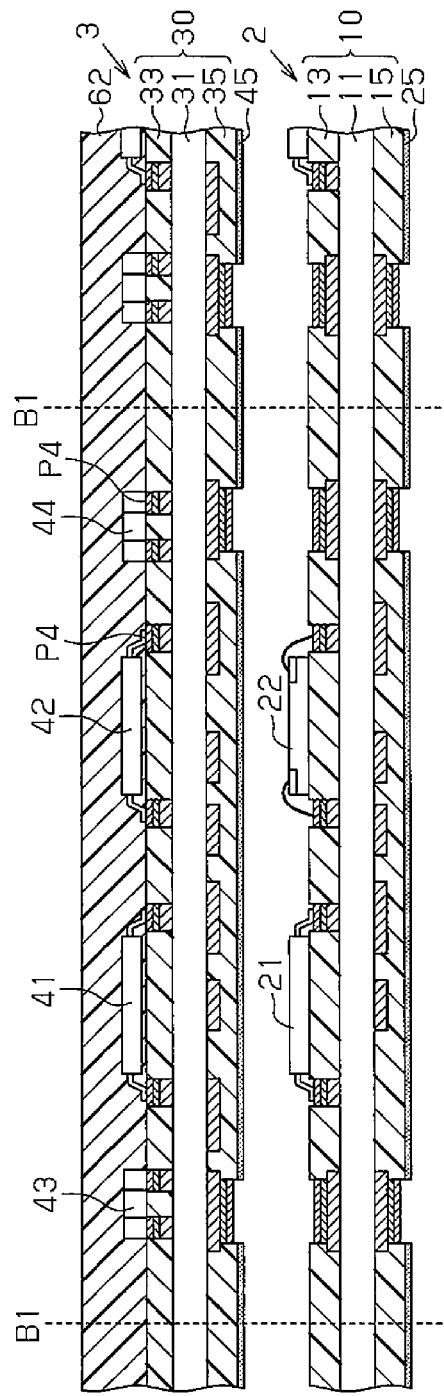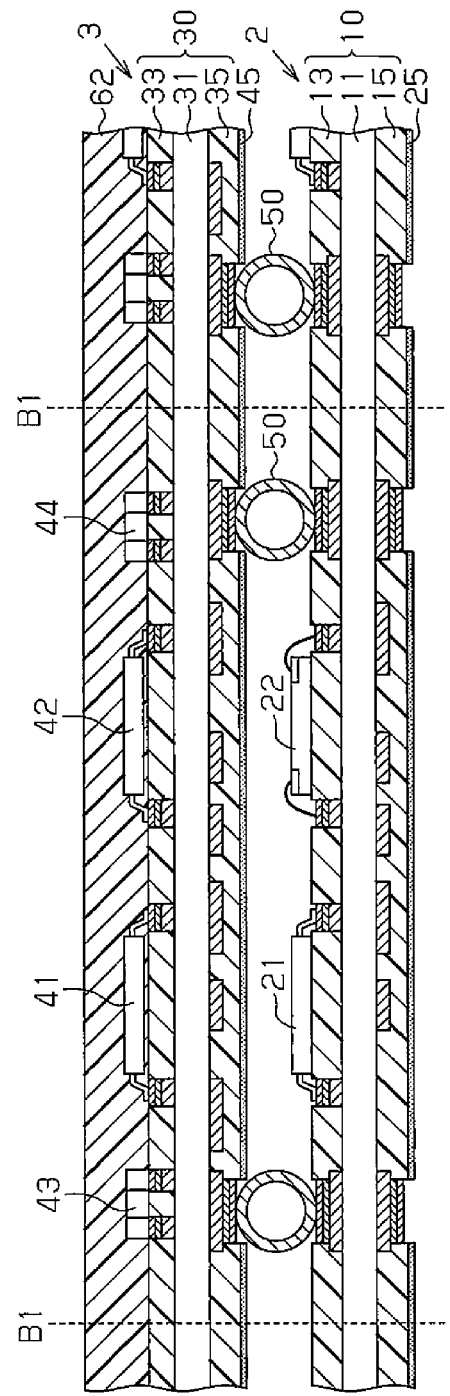

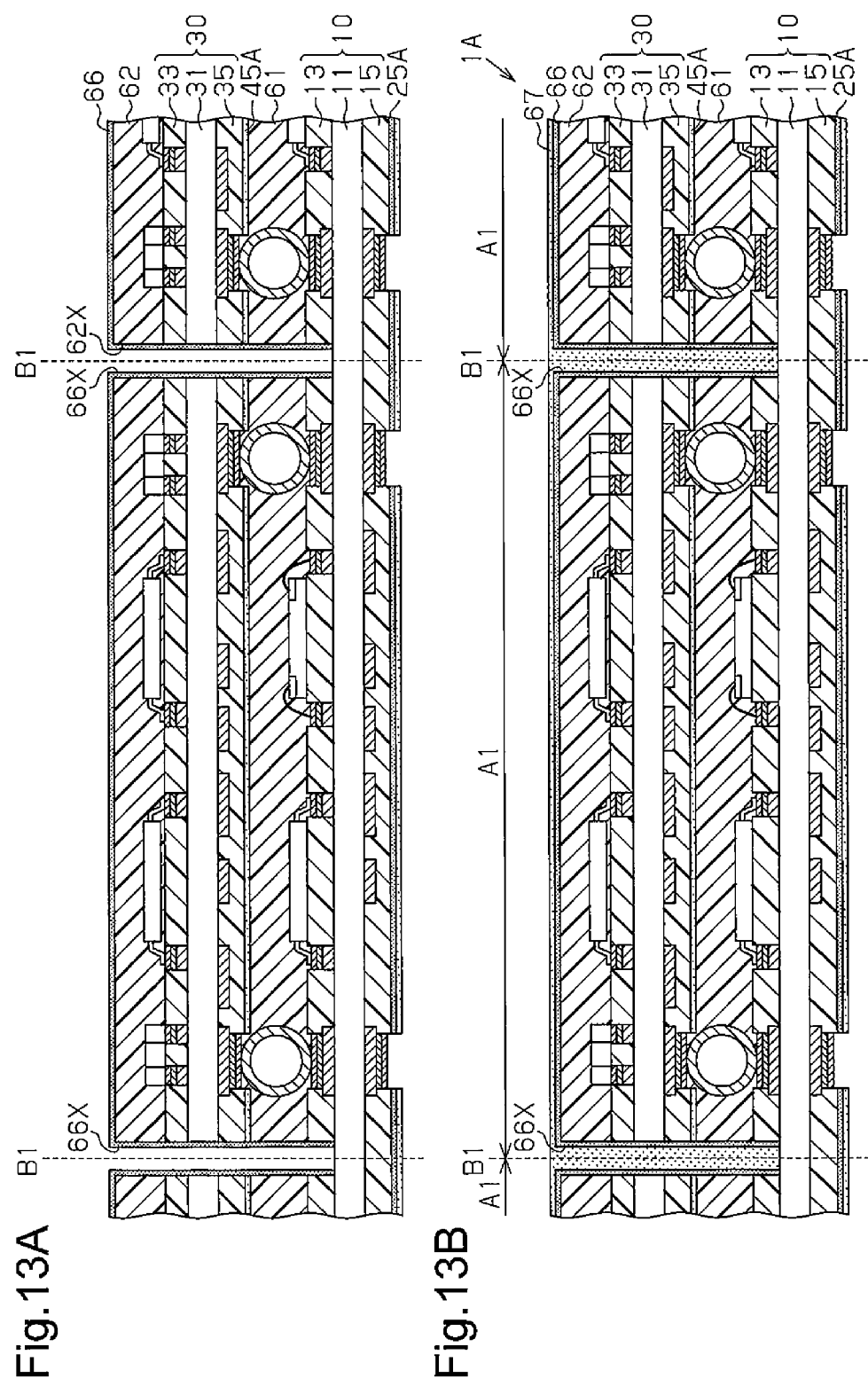

ELECTRONIC DEVICE

CROSS-REFERENCE TO RELATED APPLICATIONS

This application is based upon and claims the benefit of priority from prior Japanese Patent Application No. 2013-250145, filed on Dec. 3, 2013, the entire contents of which are incorporated herein by reference.

BACKGROUND

The present invention relates to an electronic device and a method for manufacturing an electronic device.

An electronic device may include electronic components mounted on a wiring substrate. Electronic components emit electromagnetic waves when operated. Further, electronic components receive external electromagnetic waves from external devices. Known methods for suppressing the emission and reception of electromagnetic waves include, for example, the formation of a ferrite film, a metal film, or the like, and the fastening of a metal shield case to the wiring substrate (for example, refer to International Publication No. WO2005/081609 and Japanese Laid-Open Patent Publication No. 2011-124366).

SUMMARY

Different types of electronic components may be mounted on a wiring substrate. When a ferrite film is directly formed on such different types of electronic components, the ferrite film may not have a smooth surface. This may hinder the formation of a desirable ferrite film, which includes a rod-shaped crystal structure. Further, when an electrode terminal is exposed from the surface of an electronic component, the adhesion would be weak between the surface of the electrode terminal (i.e., metal) and the ferrite film. In such a case, the desirable ferrite film cannot be formed. If the desirable ferrite film cannot be formed, the emission and reception of electromagnetic waves cannot be sufficiently suppressed.

One aspect of the present invention is an electronic device that includes a plurality of wiring substrates, a plurality of electronic components, a first magnetic thin film, a first encapsulation resin, and a second magnetic thin film. The wiring substrates are stacked upon one another with a connection member arranged between adjacent ones of the wiring substrates. The connection member electrically connects the adjacent ones of the wiring substrates, and each of the wiring substrates includes a solder resist layer as a lowermost layer. The electronic components are mounted on the wiring substrates so that at least one of the electronic components is mounted on each of the wiring substrates. The first magnetic thin film covers a lower surface of the solder resist layer of an upper one of the adjacent ones of the wiring substrates. The first encapsulation resin is formed on an upper surface of the uppermost one of the wiring substrates and encapsulates the electronic component mounted on the uppermost one of the wiring substrates. The second magnetic thin film entirely covers an upper surface of the first encapsulation resin and covers a lower surface of the solder resist layer on the lowermost one of the wiring substrates.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 3A and 3B are schematic cross-sectional views illustrating a method for manufacturing the electronic device of the first embodiment;

FIGS. 4A and 4B are schematic cross-sectional views illustrating the method for manufacturing the electronic device of the first embodiment;

FIGS. 5A and 5B are schematic cross-sectional views illustrating the method for manufacturing the electronic device of the first embodiment;

FIGS. 6A and 6B are schematic cross-sectional views illustrating the method for manufacturing the electronic device of the first embodiment;

FIGS. 8A and 8B are schematic cross-sectional views illustrating a method for manufacturing an electronic device of a modified example;

FIGS. 13A and 13B are schematic cross-sectional views illustrating the method for manufacturing the electronic device of the second embodiment;

DESCRIPTION OF THE EMBODIMENTS

Figure 1:
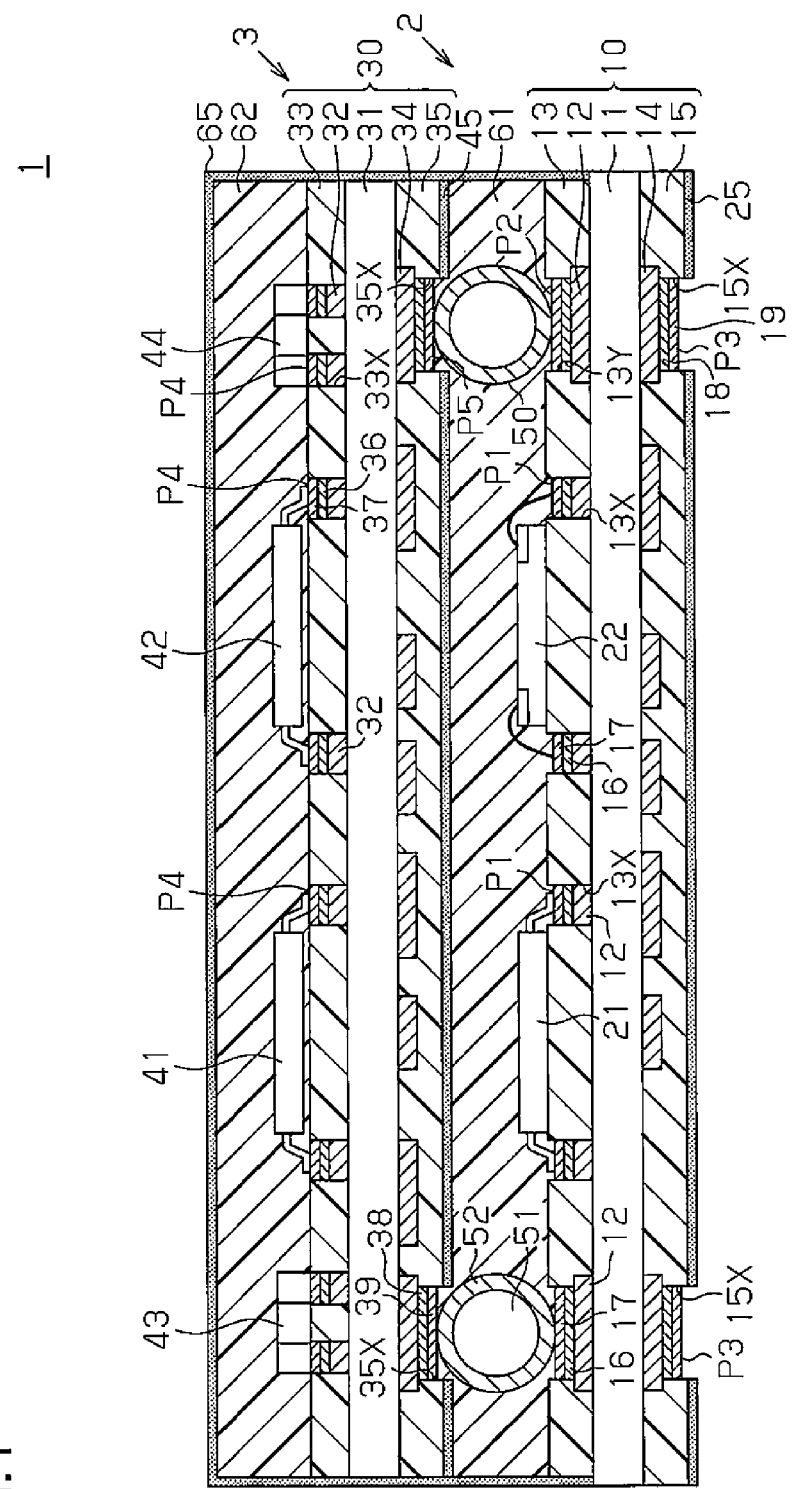
FIG. 1 is a schematic cross-sectional view illustrating an electronic device of a first embodiment.

Various embodiments will now be described with reference to the accompanying drawings. In the drawings, elements have not necessarily been drawn to scale. In the cross-sectional drawings, components may be illustrated without hatching lines.

First Embodiment

A first embodiment will now be described with reference to FIGS. 1 to 7.

As illustrated in FIG. 1, an electronic device 1 includes a plurality (in FIG. 1, two) of semiconductor packages 2 and 3, a plurality of solder balls 50, encapsulation resins 61 and 62, and a magnetic thin film 65. The semiconductor package 2 is connected to the semiconductor package 3 by the solder balls 50.

The structure of the semiconductor package 2 will now be described.

The semiconductor package 2 includes a wiring substrate 10, electronic components 21 and 22, which are mounted on the upper side of the wiring substrate 10, and a magnetic thin film 25.

The wiring substrate 10 includes a substrate main body 11, wiring patterns 12 located at the uppermost position, a solder resist layer 13, wiring patterns 14 located at the lowermost position, and a solder resist layer 15.

The substrate main body 11 only needs to have a structure that electrically connects the wiring patterns 12 and 14 through the substrate. Thus, a wiring layer may or may not be formed in the substrate main body 11. For example, the wiring patterns 12 and 14 are electrically connected by a through electrode, which extends through the substrate main body 11 in the thicknesswise direction. In this case, for example, an insulative resin such as a glass epoxy resin, a ceramic, or a silicon may be used as the material of the substrate main body 11. Also, for example, through hole via or a stacked via may be used as the through electrode (via). In contrast, when a wiring layer is formed in the substrate main body 11, for example, a plurality of the wiring layers are stacked with interlayer insulation layers arranged in between. The wiring patterns 12 and 14 are electrically connected by a via formed in the interlayer insulation layers and the wiring layers. In this case, for example, a cored build-up substrate, which includes a core substrate, or a coreless substrate, which does not include a core substrate, may be used as the substrate main body 11.

The wiring patterns 12 are formed on a mount surface (in this case, upper surface) of the substrate main body 11, on which the electronic components 21 and 22 are mounted. For example, copper (Cu) or a copper alloy may be used as the material of the wiring patterns 12.

The solder resist layer 13 is stacked on the upper surface of the substrate main body 11 and covers portions of the wiring patterns 12. For example, an insulative resin, such as an epoxy resin or an acrylic resin, may be used as the material of the solder resist layer 13. Preferably, for example, a photosensitive insulative resin may be used as the material of the solder resist layer 13. The solder resist layer 13 has a flat and smooth upper surface. For example, the upper surface of the solder resist layer 13 has a lower surface roughness than the upper surface of the substrate main body 11. For example, the upper surface of the solder resist layer 13 may have a surface roughness Ra value of approximately 2 to 10 nm. Here, the surface roughness Ra is a value indicating the surface roughness and referred to as the arithmetic average roughness. More specifically, the surface roughness parameter Ra is an arithmetic average calculated by measuring the absolute value of the height, which varies within a measurement region, from a plane serving as the mean line.

The solder resist layer 13 includes a plurality of openings 13X and 13Y, which expose portions of the wiring patterns 12. Here, if necessary, a surface-processed layer may be formed on the wiring patterns 12, which are exposed from the openings 13X and 13Y. Examples of the surface-processed layer are a gold (Au) layer, a nickel (Ni) layer/Au layer (a metal layer in which an Ni layer and an Au layer are stacked in this order), and an Ni layer/palladium (Pd) layer/Au layer (a metal layer in which an Ni layer, an Au layer, and a Pd layer are stacked in this order). For example, a metal layer formed in an electroless plating process (electroless plating metal layer) may be used as the Ni layer, the Pd layer, or the Au layer. Additionally, the Ni layer is a metal layer formed from Ni or an Ni alloy, the Au layer is a metal layer formed from Au or an Au alloy, and the Pd layer is a metal layer formed from Pd or a Pd alloy. Further, an anti-oxidation process, such as an organic solderability preservative (OSP) process, may be performed to form the surface-processed layer on the wiring patterns 12, which are exposed from the openings 13X and 13Y.

In the present example, a metal layer 16, which is an Ni layer, and a metal layer 17, which is an Au layer, are stacked in this order on the wiring patterns 12, which are exposed from the openings 13X and 13Y. In this case, the metal layer 17, which is exposed from each opening 13X, functions as a mount pad P1, which is electrically connected to one of the electronic components 21 and 22. Also, the metal layer 17, which is exposed from each opening 13Y, functions as a connection pad P2, which is electrically connected to the semiconductor package 3. Each of the mount pads P1 and the connection pads P2 may have any shape or size as viewed from above. For example, the mount pads P1 and the connection pads P2 may be circular as viewed from above.

The wiring patterns 14 are formed on a lower surface of the substrate main body 11 opposite to the mount surface. For example, copper or a copper alloy may be used as the material of the wiring patterns 14.

The solder resist layer 15 is formed as the lowermost layer of the wiring substrate 10. More specifically, the solder resist layer 15 is stacked on a lower surface of the substrate main body 11 covering portions of the wiring patterns 14. For example, an insulative resin, such as an epoxy resin or an acrylic resin, may be used as the material of the solder resist layer 15. Preferably, for example, a photosensitive insulative resin may be used as the material of the solder resist layer 15. The solder resist layer 15 has a flat and smooth lower surface. For example, the lower surface of the solder resist layer 15 has a lower surface roughness than the lower surface of the substrate main body 11. For example, the lower surface of the solder resist layer 15 may have a surface roughness Ra value of approximately 2 to 10 nm.

The solder resist layer 15 includes a plurality of openings 15X, which expose portions of the wiring patterns 14. Here, if necessary, a surface-processed layer may be formed on lower surfaces of the wiring patterns 14, which are exposed from the openings 15X. Examples of the surface-processed layer are an Au layer, an Ni layer/Au layer, and an Ni layer/Pd layer/Au layer. Further, an anti-oxidation process, such as the OSP process, may be performed so that the surface-processed layer is formed on the lower surfaces of the wiring patterns 14, which are exposed from the openings 15X.

In the present example, a metal layer 18, which is the Ni layer, and a metal layer 19, which is an Au layer, are stacked in this order on the lower surfaces of the wiring patterns 14, which are exposed from the openings 15X. In this case, the metal layer 19, which is exposed from each opening 15X, functions as an external connection pad P3. The external connection pad P3 is connected to an external connection terminal, such as a solder ball or a lead pin, which is used when the electronic device 1 is mounted on a mount substrate, such as a motherboard. The external connection pad P3 may have any shape or size as viewed from above. For example, the external connection pad P3 is circular as viewed from above.

The wiring pattern 14 exposed from each opening 15X (or the surface-processed layer when a surface-processed layer is formed on the wiring pattern 14) may be used as an external connection terminal.

The electronic components 21 and 22 are mounted on the upper surface of the wiring substrate 10. The electronic component 21 is, for example, a semiconductor device included in a power supply circuit unit. The package form of the electronic component 21 is, for example, a quad flat package (QFP). A lead of the electronic component 21 is connected to the mount pad P1 with solder (not illustrated). The electronic component 22 is, for example, a rechargeable battery. The electronic component 22 (rechargeable battery) is connected to the mount pad P1 with a conductive wire. The power supply circuit unit (electronic component 21) controls the charging of the rechargeable battery (electronic component 22). Further, the power supply circuit unit (electronic component 21) includes, for example, a DC-DC converter, and generates power supply voltage that is supplied to a control circuit unit and a high frequency circuit unit, which will be described later, based on the electric power stored in the rechargeable battery (electronic component 22).

The package form of each electronic component 21 and 22 may be modified to, for example, a dual inline package (DIP), a small outline package (SOP), a ball grid array (BGA), a land grid array (LGA), or a pin grid array (PGA). The electronic components 21 and 22 may each be flip-chip-mounted on the mount pad P1.

The magnetic thin film 25 is formed on the lower surface of the solder resist layer 15, which is formed on the wiring substrate 10 as the lowermost layer. The magnetic thin film 25 entirely covers the lower surface of the solder resist layer 15. For example, an outer side surface of the magnetic thin film 25 is substantially flush with an outer side surface of the solder resist layer 15. The magnetic thin film 25 functions to block or attenuate external electromagnetic waves that may, for example, enter the electronic device 1 and affect the electronic components 21 and 22 and the like. Further, the magnetic thin film 25 functions to block or attenuate electromagnetic waves having the frequency corresponding to the electronic circuit including the electronic components 21 and 22 or an electronic circuit including electronic components 41 to 44, which will be described later.

The metals included in the magnetic thin film 25 may be of any type and ratio. Preferably, for example, a ferrite (magnetic material) thin film containing nickel (Ni) and zinc (Zn) may be used as the magnetic thin film 25. Hereinafter, for the sake of brevity, the ferrite thin film containing Ni and Zn may be referred to as the "Ni—Zn ferrite film". Preferably, the composition of such a magnetic thin film 25 (Ni—Zn ferrite film) is set in accordance with the electronic components 41 to 44 (control circuit unit and high frequency circuit unit), which will be described later. For example, a ferrite thin film containing manganese (Mn) and zinc (Zn) may be used as the magnetic thin film 25. Preferably, the composition of such a magnetic thin film 25 is set in accordance with the electronic components 21 and 22 (power supply circuit unit and rechargeable battery). Hereinafter, for the sake of brevity, the ferrite thin film containing Mn and Zn may be referred to as the "Mn—Zn ferrite film". For example, the thickness of the magnetic thin film 25 may be approximately 1 to 3 µm.

The complex magnetic permeability µ of a magnetic material (ferrite), which is excited by alternating current, is expressed as $\mu=\mu'-j\mu''$.

The imaginary component $\mu''$ is a magnetic loss factor that is needed for absorbing electromagnetic waves. Due to the magnetic loss characteristics, the magnetic material converts the electromagnetic waves, which is in the frequency band corresponding to the resonance frequency, to heat energy. The resonance frequency of a ferrite corresponds to the composition of the ferrite. Thus, by appropriately changing the composition of the ferrite, the resonance frequency may be set at a desirable value. In the frequency band corresponding to the resonance frequency, use of such a ferrite lowers the strength of electromagnetic waves, which permeates the ferrite.

The basic composition of the ferrite is $M.Fe_3O_4$, where M is a bivalent metal ion. Such a ferrite is referred to as a spinel ferrite. Bivalent metal ions are, for example, iron (Fe), manganese (Mn), zinc (Zn), nickel (Ni), magnesium (Mg), cobalt (Co), and copper (Cu). Ferrite has characteristics corresponding to the type and the ratio of one or more metal ions included as M.

For example, the ferrite containing zinc (Zn ferrite) is antiferromagnetic and does not exhibit ferromagnetism. However, when added to a ferrite containing another metal, zinc forms a pluralistic ferrite and intensifies the magnetic state (increases the saturation magnetic flux density). Further, the addition of zinc changes the ferrite to a soft magnetic state.

The complex magnetic permeability and the resonance frequency of the ferrite change in correspondence with the contained amount of zinc and cobalt. For example, an increase in the contained amount of zinc increases the complex magnetic permeability and decreases the resonance frequency of the complex magnetic permeability. In contrast, a decrease in the contained amount of zinc decreases the complex magnetic permeability and increases the resonance frequency of the complex magnetic permeability. An increase in the contained amount of cobalt increases the complex magnetic permeability and the resonance frequency of the complex magnetic permeability.

Figure 2:
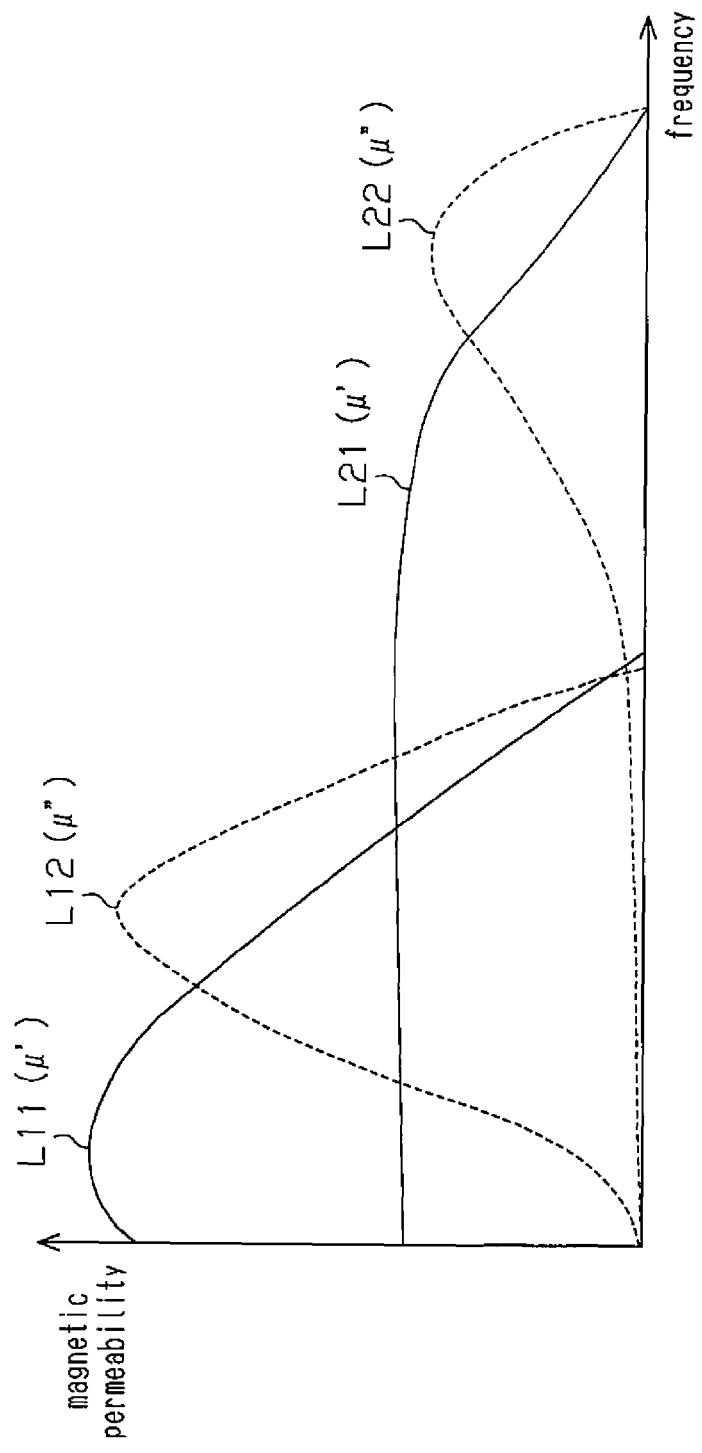
FIG. 2 is a chart illustrating the characteristics of a magnetic thin film.

FIG. 2 illustrates one example of the relationship of the complex magnetic permeability and the frequency characteristics in an Mn—Zn ferrite film and an Ni—Zn ferrite film. In FIG. 2, the solid line L11 indicates the real component $\mu'$ of the complex magnetic permeability of the Mn—Zn ferrite film, and the broken line L12 indicates the imaginary component $\mu''$ of the complex magnetic permeability of the Mn—Zn ferrite film. Additionally, the solid line L21 indicates the real component $\mu'$ of the complex magnetic permeability of the Ni—Zn ferrite film, and the broken line L22 indicates the imaginary component $\mu''$ of the complex magnetic permeability of the Ni—Zn ferrite film.

For example, the resonance frequency of the Ni—Zn ferrite film has several GHz. The resistivity of the Ni—Zn ferrite film is approximately $1\times10^6$ ($\Omega\cdot m$). The Ni—Zn ferrite film may be used as an electrically insulative material. This allows the Ni—Zn ferrite film to effectively inhibit permeation of electromagnetic waves in a high frequency band, which has approximately several GHz (for example, high frequency noise). Further, the Ni—Zn ferrite film may inhibit permeation of electromagnetic waves in a low frequency band, which has approximately several MHz (for example, low frequency noise). However, the Ni—Zn ferrite film inhibits high frequency noise more effectively than low frequency noise.

For example, the resonance frequency of the Mn—Zn ferrite film has several MHz, and the resistivity is approximately 0.1 to 10 ($\Omega\cdot m$). This allows the Mn—Zn ferrite film to effectively inhibit permeation of electromagnetic waves in a low frequency band, which has approximately several MHz (for example, low frequency noise).

The structure of the semiconductor package 3 will now be described.

The semiconductor package 3 includes a wiring substrate 30, the electronic components 41 to 44, which are mounted on the wiring substrate 30, and a magnetic thin film 45.

The wiring substrate 30 includes a substrate main body 31, wiring patterns 32 that are located at the uppermost position, a solder resist layer 33, wiring patterns 34 that are located at the lowermost position, and a solder resist layer 35.

The substrate main body 31 only needs to have a structure that electrically connects the wiring patterns 32 and 34 through the substrate. Thus, a wiring layer may or may not be formed in the substrate main body 31. For example, the wiring patterns 32 and 34 are electrically connected by a through electrode, which extends through the substrate main body 31 in the thicknesswise direction. In this case, for example, an insulative resin such as a glass epoxy resin, a ceramic, or silicon may be used as the material of the substrate main body 31. For example, a through hole via or a stacked via may be used as the through electrode (via). In contrast, when a wiring layer is formed in the substrate main body 31, for example, a plurality of the wiring layers are stacked with interlayer insulation layers arranged in between. The wiring patterns 32 and 34 are electrically connected by a via formed in the interlayer insulation layers and the wiring layers. In this case, for example, a cored build-up substrate, which includes a core substrate, and a coreless substrate, which does not include a core substrate, may be used as the substrate main body 31.

The wiring patterns 32 are formed on a mount surface (in this case, upper surface) of the substrate main body 31, on which the electronic components 41 to 44 are mounted. For example, copper or a copper alloy may be used as the material of the wiring patterns 32.

The solder resist layer 33 is stacked on an upper surface of the substrate main body 31 and covers portions of the wiring patterns 32. For example, an insulative resin, such as an epoxy resin or an acrylic resin, may be used as the material of the solder resist layer 33. Preferably, for example, a photosensitive insulative resin may be used as the material of the solder resist layer 33. The solder resist layer 33 has a flat and smooth upper surface. For example, the upper surface of the solder resist layer 33 has a lower surface roughness than an upper surface of the substrate main body 31. For example, the roughness degree of the upper surface of the solder resist layer 33 may have a surface roughness parameter Ra value of approximately 2 to 10 nm.

The solder resist layer 33 includes a plurality of openings 33X exposing portions of the wiring patterns 32. Here, if necessary, a surface-processed layer may be formed on the wiring pattern 32, which is exposed from each opening 33X. Examples of the surface-processed layer are an Au layer, an Ni layer/Au layer, or an Ni layer/Pd layer/Au layer. Further, an anti-oxidation process, such as the OSP process, may be performed so that the surface-processed layer is formed on the wiring pattern 32, which is exposed from each opening 33X.

In the present example, a metal layer 36, which is an Ni layer, and a metal layer 37, which is an Au layer, are stacked in this order on the wiring patterns 32, which are exposed from the openings 33X. In this case, the metal layer 37, which is exposed from each opening 33X, functions as a mount pad P4, which is electrically connected to one of the electronic components 41 to 44. Each mount pad P4 may have any shape or size as viewed from above. For example, each mount pad P4 is circular as viewed from above.

The wiring patterns 34 are formed on a lower surface of the substrate main body 31 opposite to the mount surface. For example, copper or a copper alloy may be used as the material of the wiring patterns 34.

The solder resist layer 35 is formed as the lowermost layer of the wiring substrate 30. More specifically, the solder resist layer 35 is stacked on the lower surface of the substrate main body 31 and covers portions of the wiring patterns 34. For example, an insulative resin, such as an epoxy resin or an acrylic resin, may be used as the material of the solder resist layer 35. Preferably, for example, a photosensitive insulative resin may be used as the material of the solder resist layer 35. The solder resist layer 35 has a flat and smooth lower surface. For example, the lower surface of the solder resist layer 35 has a lower surface roughness than the lower surface of the substrate main body 31. For example, the lower surface of the solder resist layer 35 may have a surface roughness Ra value of approximately 2 to 10 nm.

The solder resist layer 35 includes a plurality of openings 35X, which expose portions of the wiring patterns 34. Here, if necessary, a surface-processed layer may be formed on lower surfaces of the wiring patterns 34, which are exposed from the openings 35X. Examples of the surface-processed layer are an Au layer, an Ni layer/Au layer, and an Ni layer/Pd layer/Au layer. Further, an anti-oxidation process, such as the OSP process, may be performed so that the surface-processed layer is formed on the lower surfaces of the wiring patterns 34, which are exposed from the openings 35X.

In the present example, a metal layer 38, which is an Ni layer, and a metal layer 39, which is an Au layer, are stacked in this order on the lower surfaces of the wiring patterns 34, which are exposed from the openings 35X. In this case, the metal layer 39, which is exposed from each opening 35X, functions as a connection pad P5, which is connected to the semiconductor package 2. The connection pad P5 is joined with a solder ball 50. The solder ball 50 electrically connects the connection pad P5 to the connection pad P2 on the semiconductor package 2. The connection pad P5 may have any shape or size. For example, the connection pad P5 may be circular as viewed from above.

The electronic components 41 to 44 are mounted on an upper surface of the wiring substrate 30. The electronic component 41 is, for example, a semiconductor device included in the control circuit unit. The electronic component 42 is, for example, a semiconductor device included in the high frequency circuit unit. The package form of each of the electronic components 41 and 42 (semiconductor devices) is, for example, a QFP. Leads of the electronic components 41 and 42 are connected to the mount pad P4 with solder (not illustrated). The electronic component 43 is, for example, a chip included in the control circuit unit. The electronic component 44 is, for example, a chip included in the high frequency circuit unit. Examples of the chip are a resistor, a capacitor, a coil, and a diode. For example, the electronic components 43 and 44 (chips) are connected to the mount pads P4 with solder (not illustrated).

The control circuit unit (electronic components 41 and 43) includes, for example, a central processing unit (CPU) and a signal generation circuit, which generates a clock signal to operate each circuit unit. Further, the control circuit unit controls the power supply circuit unit, the high frequency circuit unit, and the like. The high frequency circuit unit (electronic components 42 and 44) includes, for example, a reception circuit and a transmission circuit, which are used for wireless communication.

The package form of each electronic component 41 and 42 may be changed to, for example, a DIP, an SOP, a BGA, an LGA, or a PGA. The electronic components 41 and 42 each may be flip-chip-mounted on the mount pads P4. Additionally, a passive element, such as a resistor or a capacitor, may include a lead.

The magnetic thin film 45 is formed on the lower surface of the solder resist layer 35, which is the lowermost layer of the wiring substrate 30. The magnetic thin film 45 entirely covers the lower surface of the solder resist layer 35. For example, an outer side surface of the magnetic thin film 45 is substantially flush with an outer side surface of the solder resist layer 35. In the present example, the magnetic thin film 45 functions to block or attenuate electromagnetic waves having the frequency corresponding to an electronic circuit including, for example, the electronic components 41 to 44.

The metals included in the magnetic thin film 45 may be of any type or ratio. For example, the magnetic thin film 45 may have the same composition as the magnetic thin film 25. For example, the Ni—Zn ferrite film may be used as the magnetic thin film 45. Preferably, the composition of such a magnetic thin film 45 (Ni—Zn ferrite film) is set in accordance with the electronic components 41 to 44 (control circuit unit and high frequency circuit unit). For example, the thickness of the magnetic thin film 45 may be approximately 1 to 3 μm.

The solder balls 50 are joined with the connection pads P5. The solder balls 50 are located between the semiconductor packages 2 and 3. The solder balls 50 are connected to the connection pads P2 and P5. Each solder ball 50 functions as a connection terminal, which connects (joins) the semiconductor packages 2 and 3, and a spacer, which maintains the distance (separated distance) of the semiconductor packages 2 and 3 at a predetermined value. The height of the solder ball 50 is set, for example, to be greater than the thickness of the electronic components 21 and 22.

In the present example, each solder ball 50 has a structure in which a spherical copper core ball 51 is covered by solder 52. The solder 52 functions as a joining material, and the copper core ball 51 functions as a spacer. That is, the solder ball 50 is joined with the connection pad P2 by the solder 52 and also joined with the connection pad P5 by the solder 52.

In this manner, the electronic device 1 having a package on package (POP) structure is formed by stacking and joining the semiconductor packages 2 and 3 with the solder balls 50.

A gap between the semiconductor packages 2 and 3 is filled with the encapsulation resin 61. The encapsulation resin 61 fixes the semiconductor package 3 to the semiconductor package 2 and encapsulates the electronic components 21 and 22, which are mounted on the wiring substrate 10. That is, the encapsulation resin 61 functions as an adhesion agent, which bonds the semiconductor packages 2 and 3, and as a protection layer, which protects the electronic components 21 and 22.

For example, an insulative resin, such as an epoxy resin or a polyimide resin, may be used as the material of the encapsulation resin 61. Also, for example, a resin material obtained by mixing a filler, such as silica ($SiO_2$), with an epoxy resin or a polyimide resin may be used as the material of the encapsulation resin 61. The filler may be an inorganic compound other than silica or an organic compound. Examples of the inorganic compound are titanium oxide, aluminum oxide, aluminum nitride, silicon carbide, calcium titanium oxide, and zeolite. Further, the encapsulation resin 61 may be a molded resin formed by performing, for example, a transfer molding process, a compression molding process, or an injection molding process.

The encapsulation resin 62 is formed on an upper surface of the solder resist layer 33, which is the uppermost layer of the wiring substrate 30, and encapsulates the electronic components 41 to 44 and the like. The encapsulation resin 62 has a flat and smooth upper surface (encapsulating resin surface). For example, the upper surface of the encapsulation resin 62 has a lower surface roughness than the upper surface of the substrate main body 31. For example, the upper surface of the encapsulation resin 62 may have a surface roughness Ra value of approximately 2 to 10 nm.

For example, an insulative resin, such as an epoxy resin or a polyimide resin, may be used as the material of the encapsulation resin 62. Also, for example, a resin material obtained by mixing a filler, such as silica, with an epoxy resin or a polyimide resin may be used as the material of the encapsulation resin 62. The filler may be an inorganic compound other than silica or an organic compound. Examples of the inorganic compound are titanium oxide, aluminum oxide, aluminum nitride, silicon carbide, calcium titanium oxide, and zeolite. Further, the encapsulation resin 62 may be formed from a molded resin, which is formed by performing, for example, a transfer molding process, a compression molding process, or an injection molding process.

The magnetic thin film 65 covers the surfaces (upper and outer side surfaces) of the encapsulation resin 62. In the present example, the magnetic thin film 65 entirely covers the outer side surfaces of the encapsulation resin 62, the solder resist layer 33, the substrate main body 31, the solder resist layer 35, the magnetic thin film 45, the encapsulation resin 61, and the solder resist layer 13. In the present example, outer side surfaces of the magnetic thin film 65 are substantially flush with outer side surfaces of the substrate main body 11, the solder resist layer 15, and the magnetic thin film 25. In other words, the substrate main body 11, the solder resist layer 15, and the magnetic thin film 25 are shaped to be larger as viewed from above by an amount corresponding to the magnetic thin film 65 than the solder resist layer 13, the encapsulation resin 61, the magnetic thin film 45, the solder resist layer 35, the substrate main body 31, solder resist layer 33, and the encapsulation resin 62.

The magnetic thin film 65 functions to block or attenuate external electromagnetic waves, which enter the electronic device 1 and affect the electronic components 41 to 44 and the like. Further, the magnetic thin film 65 functions to block or attenuate electromagnetic waves having the frequency corresponding to the electronic circuit including the electronic components 41 to 44.

The metals included in the magnetic thin film 65 may be of any type and ratio. For example, the magnetic thin film 65 may have the same composition as the magnetic thin films 25 and 45. Preferably, for example, an Ni—Zn ferrite film may be used as the magnetic thin film 65. Preferably, the composition of such a magnetic thin film 65 (Ni—Zn ferrite film) is set in accordance with the electronic components 41 to 44 (control circuit unit and high frequency circuit unit). For example, the thickness of the magnetic thin film 65 may be approximately 1 to 3 μm.

The operation of the electronic device 1 will now be described.

The encapsulation resin 62 is formed on the upper surface of the wiring substrate 30, which is the uppermost one of the two wiring substrates 10 and 30, and encapsulates the electronic components 41 to 44, which are mounted on the upper surface of the wiring substrate 30. The encapsulation resin 62 has a flat and smooth upper surface. Then, the magnetic thin film 65 (ferrite film) is formed on the upper surface of the encapsulation resin 62. This allows the magnetic thin film 65 to be formed on a flat and smooth resin surface instead of a metal surface and forms a satisfactory magnetic thin film 65 that includes a rod-shaped crystal structure.

The solder resist layer 35, which includes the flat and smooth lower surface, is formed as the lowermost layer of the wiring substrate 30, which is the upper one of the two adjacent wiring substrates 10 and 30. Then, the magnetic thin film 45 (ferrite film) is formed on the lower surface of the solder resist layer 35. This allows the magnetic thin film 45 to be formed on a flat and smooth resin surface. Thus, a satisfactory magnetic thin film 45, which includes a rod-shaped crystal structure, may be formed.

In the same manner, the solder resist layer 15, which includes a flat and smooth lower surface, is formed on the lower surface of the wiring substrate 10, which is the lower one of the two wiring substrates 10 and 30. Then, the magnetic thin film 25 (ferrite film) is formed on the lower surface of the solder resist layer 15. This allows for the formation of a satisfactory magnetic thin film 25, which includes a rod-shaped crystal structure.

As described above, the control circuit unit, which includes the electronic components 41 and 43, includes a logic circuit such as a CPU. Such a circuit includes a transistor and switches the transistor at the frequency corresponding to an operation clock signal. As a result, high frequency noise is emitted in accordance with the switching operation. In the same manner as the control circuit unit, the high frequency circuit unit, which includes the electronic components 42 and 44, also emits high frequency noise in accordance with operations. Here, the composition of each of the magnetic thin films 25, 45, and 65 (Ni—Zn ferrite film) is set, for example, in correspondence with the frequency of the noise emitted from the control circuit unit and the high frequency circuit unit. For example, an imaginary number p" included in the complex magnetic permeability p' of each of the magnetic thin films 25, 45, and 65 has a frequency band that corresponds to the high frequency noise generated in the control circuit unit and the high frequency circuit unit. Thus, the magnetic thin films 25, 45, and 65 inhibit permeation of the electromagnetic waves (noise) in the frequency band corresponding to the high frequency noise emitted from the control circuit unit and the high frequency circuit unit. As described above, each of the magnetic thin films 25, 45, and 65 is a satisfactory magnetic thin film including a rod-shaped crystal structure. This allows the magnetic thin films 25, 45, and 65 to effectively inhibit permeation of the electromagnetic waves in the frequency band, which corresponds to the high frequency noise.

The electronic components 21, 22, and 41 to 44 are indirectly covered by the magnetic thin films 25, 45, and 65. Thus, the magnetic thin films 25 and 65 decrease the amount of the high frequency noise emitted out of the control circuit unit and the high frequency unit (electronic components 41 to 44). Additionally, the magnetic thin films 25 and 65 decrease the amount of external high frequency electromagnetic waves entering signals of the control circuit unit and the high frequency circuit unit. Further, the magnetic thin film 45 decreases the amount of the high frequency noise emitted from the control circuit unit and the high frequency circuit unit (electronic components 41 to 44) and entering the power supply circuit unit (electronic components 21 and 22).

External noise, which enters the electronic device 1, is mostly high frequency noise. Thus, the Ni—Zn ferrite films (magnetic thin films 45 and 65), which are capable of effectively inhibiting permeation of high frequency noise, is formed on the outermost surface of the electronic device 1. This drastically decreases the amount of external electromagnetic waves (noise) entering the electronic device 1. External noise that enters the electronic device 1 includes low frequency noise. However, the amount of the low frequency noise is less than the high frequency noise. Thus, the Ni—Zn ferrite films (magnetic thin films 45 and 65) may also limit external low frequency noise that enters the electronic device 1.

A method for manufacturing the electronic device 1 will now be described. For the sake of brevity, portions that ultimately become elements of the electronic device 1 are indicated by reference characters used to denote the final element.

In the step illustrated in FIG. 3A, structures corresponding to the wiring substrates 10 and 30 are manufactured. The structures are manufactured through a known manufacturing method that will now be briefly described with reference to FIG. 3A.

First, to manufacture the wiring substrate 10, for example, a batch-processing substrate main body 11 is prepared. More specifically, a large substrate main body 11 is prepared to obtain a large number of the wiring substrates 10. Also, to manufacture the wiring substrate 30, for example, a batch-processing substrate main body 31 is prepared. More specifically, a large substrate main body 31 is prepared to obtain a large number of the wiring substrates 30. Each of the substrate main bodies 11 and 31 includes a large number of regions A1 where the electronic devices 1 are formed. After the formation of a structure corresponding to the electronic device 1 in each region A1, each substrate main body 11 and 31 is cut along a cutting line B1 with a dicing blade or the like. This fragmentizes structures corresponding to the electronic devices 1 and manufactures a batch of the electronic devices 1.

Next, the wiring patterns 12 are formed on the upper surface of the substrate main body 11, and the wiring patterns 14 are formed on the lower surface of the substrate main body 11. Then, the solder resist layer 13 including the openings 13X and 13Y, which expose portions of the wiring patterns 12, is formed on the upper surface of the substrate main body 11. Also, the solder resist layer 15 is formed including the openings 15X, which expose portions of the wiring patterns 14. For example, after applying a photosensitive solder resist film or a liquid photosensitive solder resist to the substrate main body 11, the solder resist undergoes a photolithography process to pattern the solder resist into a desirable shape. This forms the solder resist layers 13 and 15. The upper surface of the solder resist layer 13 and the lower surface of the solder resist layer 15, which are formed from such a photosensitive resin, are flat and smooth. Next, for example, an electroless plating process is performed to sequentially stack the metal layers 16 and 17 on the wiring patterns 12, which are exposed from the openings 13X and 13Y, and the metal layers 18 and 19 are sequentially stacked on the lower surfaces of the wiring patterns 14, which are exposed from the openings 15X. This forms the mount pads P1 and the connection pads P2 on the upper side of the wiring substrate 10, and the external connection pads P3 on the lower surface side of the wiring substrate 10.

The wiring patterns 32 are formed on the upper surface of the substrate main body 31, and the wiring patterns 34 are formed on the lower surface of the substrate main body 31. Then, the solder resist layer 33 including the openings 33X, which expose portions of the wiring pattern 32, is formed on the upper surface of the substrate main body 31. Also, the solder resist layer 35 is formed including the openings 35X, which expose portions of the wiring patterns 34. For example, after applying a photosensitive solder resist film or a liquid light sensitive solder resist to the substrate main body 31, the solder resist undergoes a photolithography process to pattern the solder resist into a desirable shape. This forms the solder resist layers 33 and 35. The upper surface of the solder resist layer 33 and the lower surface of the solder resist layer 35, which are formed from such a photosensitive resin, are flat and smooth. Next, for example, an electroless plating method is performed to sequentially stack the metal layers 36 and 37 on the wiring patterns 32, which are exposed from the openings 33X, and the metal layers 38 and 39 are sequentially stacked on the lower surfaces of the wiring patterns 34, which are exposed from the openings 35X. This forms the mount pads P4 on the upper side of the wiring substrate 30 and the connection pads P5 on the lower side of the wiring substrate 30.

The manufacturing steps described above manufacture the structures corresponding to the wiring substrates 10 and 30 in each region A1. The cross-sectional views in FIGS. 3 to 9 illustrate portions of the batch-processing substrate main bodies 11 and 31.

In the step illustrated in FIG. 3B, the magnetic thin film 25 is formed to entirely cover the lower surface of the solder resist layer 15, and the magnetic thin film 45 is formed to entirely cover the lower surface of the solder resist layer 35. The magnetic thin films 25 and 45 may be formed, for example, by performing a ferrite plating process. For example, a spin spraying may be performed as the ferrite plating process. In this process, the magnetic thin films 25 and 45 (ferrite films) are formed on the lower surfaces of the corresponding solder resist layers 15 and 35, which serve as base materials. The lower surfaces of the solder resist layers 15 and 35 are flat and smooth. This allows for the formation of satisfactory magnetic thin films 25 and 45, which include rod-shaped crystal structures, on the lower surfaces of the corresponding the solder resist layer 15 and 35. Prior to the formation of the magnetic thin films 25 and 45, a plasma treatment may be performed. The plasma treatment generates a hydroxyl group on the exposed surfaces (here, lower surfaces) of the solder resist layers 15 and 35. Metal ions, which are contained in the reaction solution used for the spin spraying, is coupled to the hydroxyl group generated on the lower surface of each solder resist layer 15 and 35. This allows for a strong adhesion between the solder resist layers 15 and 35 and the corresponding magnetic thin films 25 and 45.

When forming the magnetic thin films 25 and 45 through spin spraying, the external connection pads P3, which are exposed from the solder resist layer 15, and the connection pads P5, which are exposed from the solder resist layer 35, are masked with a masking material (not illustrated).

In the step illustrated in FIG. 4A, the electronic components 21 and 22 are mounted on the upper surface of the wiring substrate 10. For example, the electronic component 21 is soldered to the upper surface of the wiring substrate 10. This respectively connects leads of the electronic component 21 to the mount pads P1 with solder (not illustrated). For example, the electronic component 22 is mounted on the upper surface of the wiring substrate 10 by performing wire bonding. This electrically connects electrode pads of the electronic component 22 to the mount pads P1 with the conductive wires, respectively.

Then, the solder balls 50 are mounted on (joined with) the connection pads P2 and P5. For example, after applying flux to the connection pads P5, the solder balls 50 are mounted on and fixed to the connection pads P5 by performing reflow soldering at approximately 230° C. to 260° C. When flux has been applied, the surface is washed to remove the flux. Next, the wiring substrate 30, on which the solder balls 50 are mounted, is positioned above the wiring substrate 10, on which the electronic components 21 and 22 are mounted, and the solder balls 50 are joined with the connection pads P2. More specifically, first, flux is appropriately applied to each connection pad P2. Then, the wiring substrate 30 is arranged above the wiring substrate 10 with the solder balls 50 located in between. The stacked wiring substrates 10 and 30 are heated to approximately 230° C. to 260° C. in a reflow oven. This melts the solder 52 of each solder ball 50 and joins the solder ball 50 with the corresponding connection pad P2. As a result, the solder balls 50 electrically connect the connection pads P2 and P5, and the wiring substrate 30 is fixed onto the wiring substrate 10 by the solder balls 50.

In the step illustrated in FIG. 4B, the encapsulation resin 61 is formed so that the gap between the wiring substrates 10 and 30, more specifically, the gap between the solder resist layer 13 and the magnetic thin film 45 is filled with the encapsulation resin 61. The encapsulation resin 61 firmly fixes the wiring substrate 30 onto the wiring substrate 10. For example, when a thermosetting molding resin is used as the material of the encapsulation resin 61, the structure illustrated in FIG. 4A is placed in a mold. Then, the mold is pressurized (for example, to 5 to 10 MPa), and liquid mold resin is injected into the mold. The molding resin is heated to a temperature of, for example, 180° C. and hardened to form the encapsulation resin 61. Examples of processes for filling the mold with the molding resin are a transfer molding process, a compression molding process, and an injection molding process.

In the step illustrated in FIG. 5A, the electronic components 41 to 44 are mounted on the upper surface of the wiring substrate 30. For example, the electronic components 41 to 44 are soldered to the upper surface of the wiring substrate 30. This connects leads of the electronic component 41 and 42 to the mount pads P4 with solder (not illustrated), and leads of the electronic components 43 and 44 to the mount pads P4 with solder (not illustrated).

In the step illustrated in FIG. 5B, the encapsulation resin 62 is formed on the upper surface of the solder resist layer 33 to encapsulate the electronic components 41 to 44, which are mounted on the wiring substrate 30. For example, when a thermosetting mold resin is used as the material of the encapsulation resin 62, the structure illustrated in FIG. 5A is placed in a mold. Then, the mold is pressurized (for example, to 5 to 10 MPa), and the liquid mold resin is injected into the mold. The molding resin is heated to a temperature of, for example, 180° C. and hardened to form the encapsulation resin 62. In this case, the encapsulation resin 62 has a flat and smooth upper surface (encapsulating resin surface). Examples of processes for filling the mold with the molding resin are a transfer molding process, a compression molding process, and an injection molding process.

In the step illustrated in FIG. 6A, the structure illustrated in FIG. 5B is polished (half-cut) at a cutting line B1 and the surrounding area to an intermediate position in the thicknesswise direction to form a groove 62X. In the half cutting of the present example, the encapsulation resin 62 is polished from the upper side to the solder resist layer 13 at the cutting line B1 and the surrounding area. This forms the groove 62X extending through the encapsulation resins 61 and 62, the solder resist layers 13, 33, and 35, the substrate main body 31, and the magnetic thin film 45 in the thicknesswise direction. That is, the groove (62X) extends from the upper side of the encapsulation resin 62 to the solder resist layer 13 at a predetermined location in the structure. In this manner, in each region A1, the groove 62X exposes the outer side surfaces of the encapsulation resins 61 and 62, the solder resist layer 13, 33, and 35, the substrate main body 31, and the magnetic thin film 45. The groove 62X is formed by using, for example, a dicing blade or a slicer.

In the step illustrated in FIG. 6B, the magnetic thin film 65 is formed to cover the upper surface (flat and smooth surface) and the side surfaces of the encapsulation resin 62. For example, the magnetic thin film 65 is formed so that the magnetic thin film 65 entirely covers the upper surface of the encapsulation resin 62 and so that the groove 62X is filled with the magnetic thin film 65. In this step, the magnetic thin film 65 (ferrite film) is formed on the upper surface of the encapsulation resin 62, which serves as a base material. The encapsulation resin 62 has a flat and smooth upper surface. This allows for the formation of a satisfactory magnetic thin film 65 including a rod-shaped crystal structure on the upper surface of the encapsulation resin 62. Additionally, in this step, the magnetic thin film 65 covers the outer side surfaces of the encapsulation resins 61 and 62, the solder resist layers 13, 33, and 35, the substrate main body 31, and the magnetic thin film 45, which are exposed from the groove 62X. The magnetic thin film 65 may be formed, for example, by performing a spin spraying.

The manufacturing steps described above manufactures the structure corresponding to the electronic device 1 in each region A1.

Figure 7:
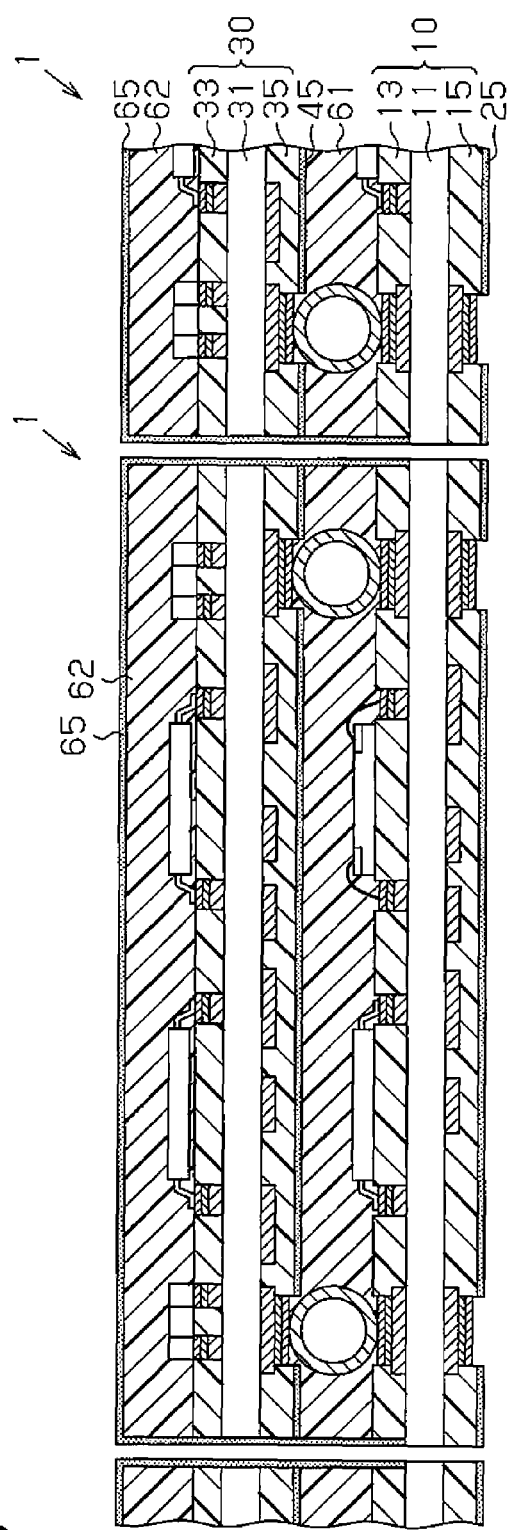
FIG. 7 is a schematic cross-sectional view illustrating the method for manufacturing the electronic device of the first embodiment.
Figure 9:
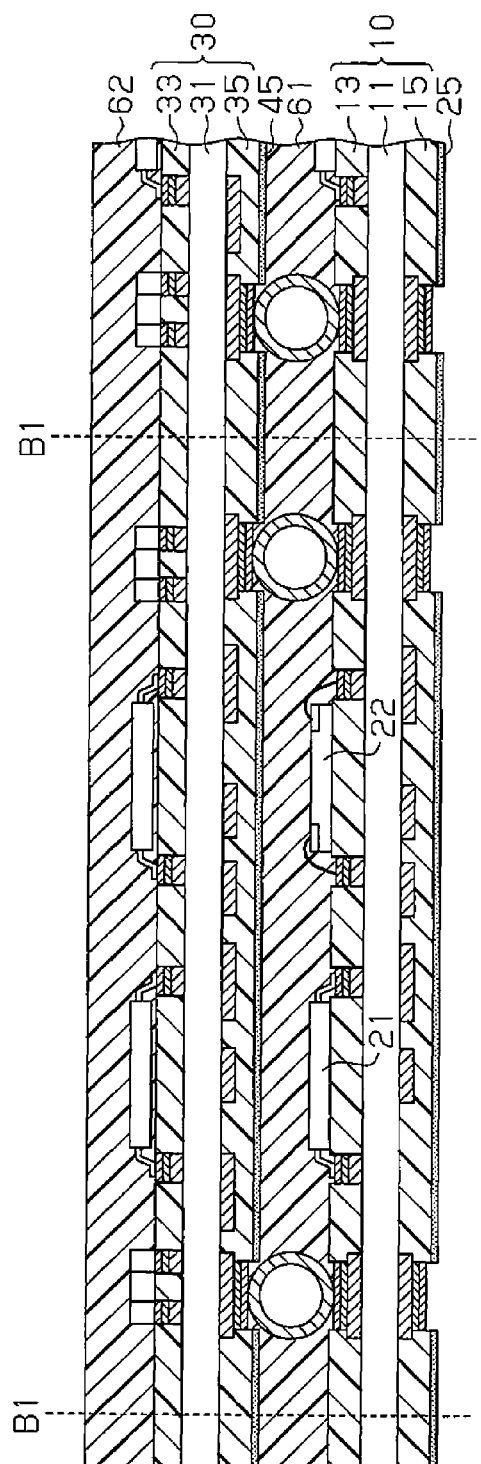
FIG. 9 is a schematic cross-sectional view illustrating the method for manufacturing the electronic device of the modified example.

In the step illustrated in FIG. 7, the structure illustrated in FIG. 6B is cut along the cutting line B1 using a dicing blade. This produces individual pieces of the electronic device 1. More specifically, by cutting the magnetic thin film 65, the substrate main body 11, the solder resist layer 15, and the magnetic thin film 25 along the cutting line B1, the individual pieces of the electronic device 1 are produced. The manufacturing steps described above manufactures a batch of the electronic devices 1. In this process, the outer side surfaces of the magnetic thin film 65 are formed to be substantially flush with the outer side surfaces of the substrate main body 11, the solder resist layer 15, and the magnetic thin film 25.

The present embodiment has the advantages described below.

(1) The encapsulation resin 62 is formed on the upper surface of the wiring substrate 30 to encapsulate the electronic components 41 to 44, which are mounted on the upper surface of the wiring substrate 30. The upper surface of the encapsulation resin 62 is flat and smooth. The magnetic thin film 65 is formed on the upper surface of the encapsulation resin 62. This allows the magnetic thin film 65 to be formed on the flat and smooth resin surface instead of a metal surface. As a result, a satisfactory magnetic thin film 65, which includes a rod-shaped crystal structure, may be formed. The magnetic thin film 65 including such a rod-shaped crystal suppresses the emission and reception of electromagnetic waves.

(2) The solder resist layer 35, which includes the flat and smooth lower surface, is formed as the lowermost layer of the wiring substrate 30. The magnetic thin film 45 is formed on the lower surface of the solder resist layer 35. This allows the magnetic thin film 45 to be formed on the flat and smooth resin surface instead of a metal surface. Thus, a satisfactory magnetic thin film 45, which includes a rod-shaped crystal structure, may be formed. The magnetic thin film 45 including such a rod-shaped crystal structure suppresses the emission and reception of electromagnetic waves.

(3) The solder resist layer 15, which includes the flat and smooth lower surface, is formed as the lowermost layer of the wiring substrate 10. The magnetic thin film 25 is formed on the lower surface of the solder resist layer 15. This allows the magnetic thin film 25 to be formed on the flat and the smooth resin surface instead of a metal surface. Thus, a satisfactory magnetic thin film 25, which includes a rod-shaped crystal structure, may be formed. The magnetic thin film 25 including such a rod-shaped crystal structure suppresses the emission and reception of electromagnetic waves.

(4) The compositions of the magnetic thin films 25, 45, and 65, which indirectly cover the electronic components 41 to 44, are set in correspondence with the frequency of the noise emitted from the electronic components 41 to 44. This allows the magnetic thin films 25 and 65 to decrease the amount of the high frequency noise emitted out of the electronic components 41 to 44. Additionally, the magnetic thin films 25 and 65 may decrease the amount of external high frequency electromagnetic waves, which enter signals of the electronic circuit including the electronic components 41 to 44. Further, the magnetic thin film 45 may decrease the amount of high frequency noise, which is emitted from the electronic components 41 to 44 and entering the electronic components 21 and 22.

(5) The Ni—Zn ferrite film, which effectively suppresses the permeation of high frequency noise, is used as the magnetic thin films 25 and 65, which are exposed to the exterior of the electronic device 1. This drastically decreases the amount of external electromagnetic waves (noise), which enter the electronic device 1.

(6) The electronic components 21, 22, and 41 to 44 are covered with the encapsulation resins 61 and 62 and the magnetic thin films 25, 45, and 65, which are thinner than a metal shield case. The magnetic thin films 25, 45, and 65 suppress the emission and reception of electromagnetic waves. This limits enlargement of the electronic device 1 compared to when using a metal shield case.

Modified Examples of First Embodiment

The first embodiment may be modified as described below.

In the first embodiment, after the wiring substrate 10 (semiconductor package 2) is coupled to the wiring substrate 30 through the solder ball 50, the gap of the wiring substrates 10 and 30 is filled with the encapsulation resin 61. Additionally, after the encapsulation resin 61 is formed, the electronic components 41 to 44 are mounted on the upper surface of the wiring substrate 30. Then, the encapsulation resin 62 is formed on the upper surface of the wiring substrate 30 to encapsulate the electronic components 41 to 44. However, the encapsulation resins 61 and 62 do not have to be formed in such a manner.

For example, as illustrated in FIG. 8A, before the wiring substrate 30 is coupled to the wiring substrate 10, the electronic components 41 to 44 may be mounted on the upper surface of the wiring substrate 30. Then, the encapsulation resin 62 may be formed on the upper surface of the wiring substrate 30 to encapsulate the electronic components 41 to 44. At this time, the electronic components 21 and 22 are formed on the upper surface of the wiring substrate 10. Next, in the step illustrated in FIG. 8B, the semiconductor package 3 (wiring substrate 30), on which the encapsulation resin 62 is formed, is fixed to the semiconductor package 2 (wiring substrate 10) by the solder balls 50. That is, the wiring substrates 10 and 30 are stacked, with the solder balls 50 arranged in between, so that the wiring substrate 30, on which the encapsulation resin 62 is formed, is located at the uppermost side. In the step illustrated in FIG. 9, the encapsulation resin 61 is formed so that the gap between the wiring substrates 10 and 30 is filled with the encapsulation resin 61 and so that the encapsulation resin 61 encapsulates the electronic components 21 and 22, which are mounted on the wiring substrate 10. Then, the manufacturing steps illustrated in FIGS. 6 and 7 are performed. This simultaneously manufactures a plurality of the electronic devices 1 in the same manner as the first embodiment.

In the first embodiment, the magnetic thin films 25, 45, and 65 have the same composition. Instead, the magnetic thin films 25, 45, and 65 may have different compositions or one of the magnetic thin films 25, 45, and 65 may have a composition differing from the other two.

Figure 10:
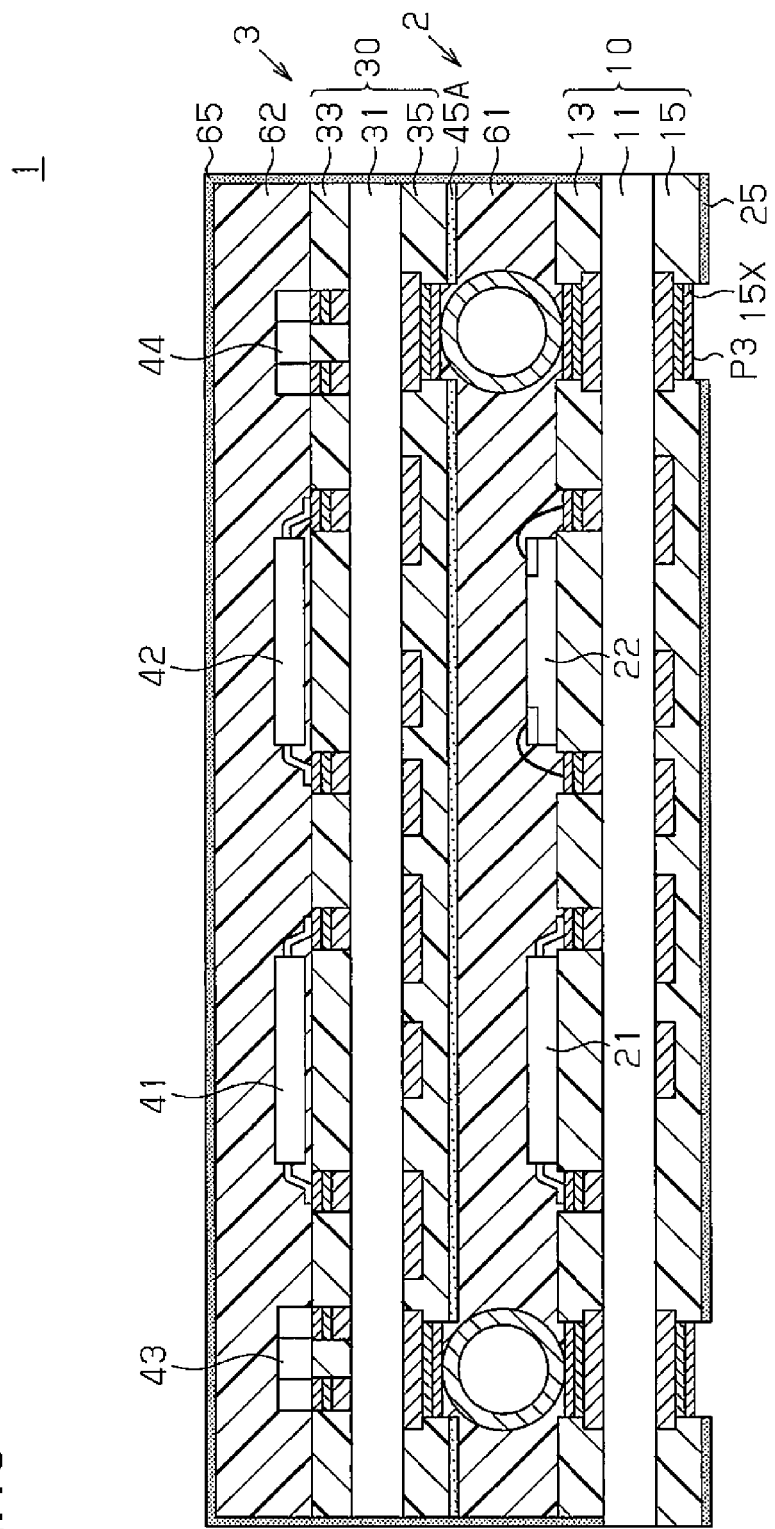
FIG. 10 is a schematic cross-sectional view illustrating the electronic device of the modified example.

For example, as illustrated in FIG. 10, the composition of the magnetic thin films 25 and 65 may be set to differ from that of a magnetic thin film 45A. That is, the composition of the magnetic thin films 25 and 65, which are exposed, may differ from that of the magnetic thin film 45A, which is arranged between the two adjacent wiring substrates 10 and 30 in the vertical direction.

For example, in the same manner as the first embodiment, the Ni—Zn ferrite film may be used as the magnetic thin films 25 and 65. For example, an Mn—Zn ferrite film, which is capable of effectively suppressing the permeation of low frequency noise, may be used as the magnetic thin film 45A. In this case, preferably, the composition of the magnetic thin film 45A (Mn—Zn ferrite film) may be set in accordance with the electronic components 21 and 22 (power supply circuit unit and rechargeable battery).

The power supply circuit unit (electronic component 21) emits low frequency noise in correspondence with the operation of a circuit used to generate the power supply voltage (for example, DC-DC converter). Here, the composition of the magnetic thin film 45A (Mn—Zn ferrite film) is set in accordance with the frequency of noise emitted from the power supply circuit unit. For example, the imaginary component $\mu''$ included in the complex magnetic permeability $\mu$ of the magnetic thin film 45A has the frequency band that is set to a value corresponding to the low frequency noise generated in the power supply circuit unit. Thus, the magnetic thin film 45A suppresses the permeation of electromagnetic waves (noise) at the frequency band corresponding to the low frequency noise emitted from the power supply circuit unit. Consequently, the magnetic thin film 45A may decrease the amount of low frequency noise emitted from the power supply circuit unit and entering the electronic components 41 to 44 (control circuit unit and high frequency circuit unit).

When a metal plating film is used to suppress the emission and reception of electromagnetic waves, the permeation of low frequency noise cannot be suppressed. This is because, when the metal plating film is thin, eddy current is not produced in the metal plating film when lower frequency electromagnetic waves strike the metal plating film. In contrast, in the magnetic thin film (ferrite film), even when the magnetic thin film 45A is thin, the permeation of low frequency noise may be suppressed by adjusting the composition of the magnetic thin film 45A.

Second Embodiment

A second embodiment will now be described with reference to FIGS. 11 to 14. An electronic device 1A of the present embodiment differs from the modified example illustrated in FIG. 10 in that the magnetic thin films 25 and 65 are changed to magnetic thin films 25A and 65A. Here, the description will focus on the differences from the first embodiment and the modified examples. Like or same reference numerals are given to those components that are the same as the corresponding components illustrated in FIGS. 1 to 10. Such components will not be described in detail.

Figure 11:
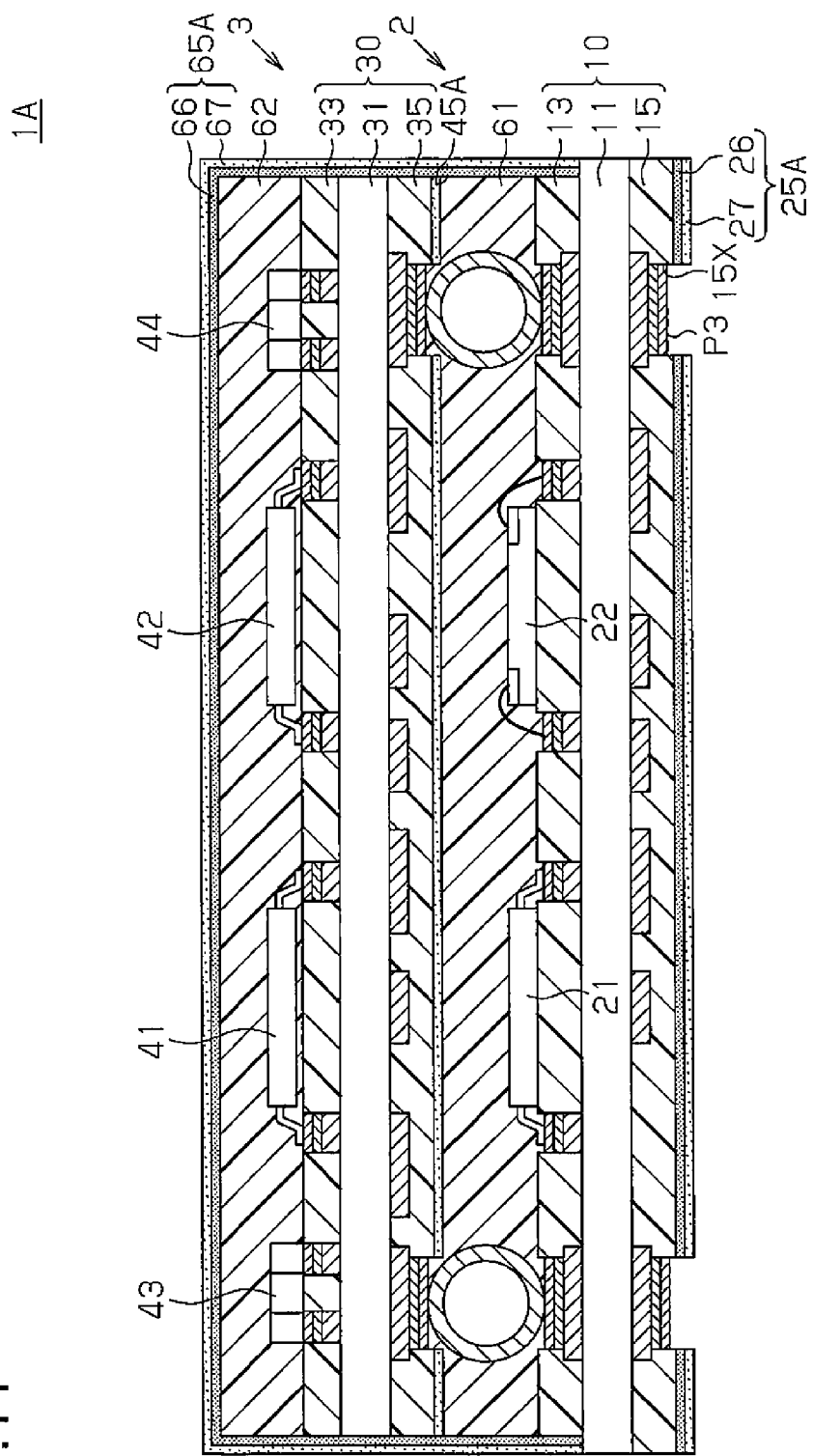
FIG. 11 is a schematic cross-sectional view illustrating an electronic device of a second embodiment.

As illustrated in FIG. 11, the magnetic thin film 25A covers the lower surface of the solder resist layer 15, which is formed as the lowermost layer of the wiring substrate 10. The magnetic thin film 25A includes a plurality of (here, two) magnetic thin films 26 and 27, which are sequentially stacked on the lower surface of the solder resist layer 15. The magnetic thin film 26 is formed to entirely cover the lower surface of the solder resist layer 15. The magnetic thin film 27 entirely covers a lower surface of the magnetic thin film 26. Outer side surfaces of the magnetic thin films 26 and 27 are substantially flush with the outer side surfaces of the solder resist layer 15.

The magnetic thin film 65A covers the upper surface and the outer side surfaces of the encapsulation resin 62. The magnetic thin film 65A includes a plurality of (here, two) magnetic thin films 66 and 67, which are sequentially stacked on the encapsulation resin 62. In the present example, the magnetic thin film 66 entirely covers the upper surface and the outer side surfaces of the encapsulation resin 62 and the outer side surfaces of the solder resist layer 33, the substrate main body 31, the solder resist layer 35, the magnetic thin film 45A, the encapsulation resin 61, and the solder resist layer 13. The magnetic thin film 67 entirely covers the surfaces (upper and outer side surfaces) of the magnetic thin film 66. For example, outer side surfaces of the magnetic thin film 67 are substantially flush with the outer side surfaces of the substrate main body 11, the solder resist layer 15, and the magnetic thin film 25A.

The metals included in the magnetic thin film 26, 27, 66, and 67 may be of any type and ratio. However, the composition of the magnetic thin films 26 and 66 is set to differ from that of the magnetic thin films 27 and 67. Preferably, for example, Ni—Zn ferrite films may be used as the magnetic thin films 26 and 66. Preferably, the composition of the magnetic thin films 26 and 66 (Ni—Zn ferrite films) is set in accordance with the electronic components 41 to 44 (control circuit unit and high frequency circuit unit). Preferably, for example, Mn—Zn ferrite films may be used as the magnetic thin films 27 and 67. Preferably, the composition of such magnetic thin films 27 and 67 (Mn—Zn ferrite films) is set in accordance with the electronic components 21 and 22 (power supply circuit unit and rechargeable battery). Further, preferably, the compositions of the magnetic thin films 26, 27, 66, and 67 are set so that the magnetic thin films 26 and 66 (Ni—Zn ferrite films) have higher resistivity than the magnetic thin films 27 and 67 (Mn—Zn ferrite films).

The method for manufacturing the electronic device 1A will now be described with reference to FIGS. 12 to 14. For the sake of brevity, portions that ultimately become elements of the electronic device 1A are indicated by reference characters used to denote the final element.

Figures 12A, 12B:
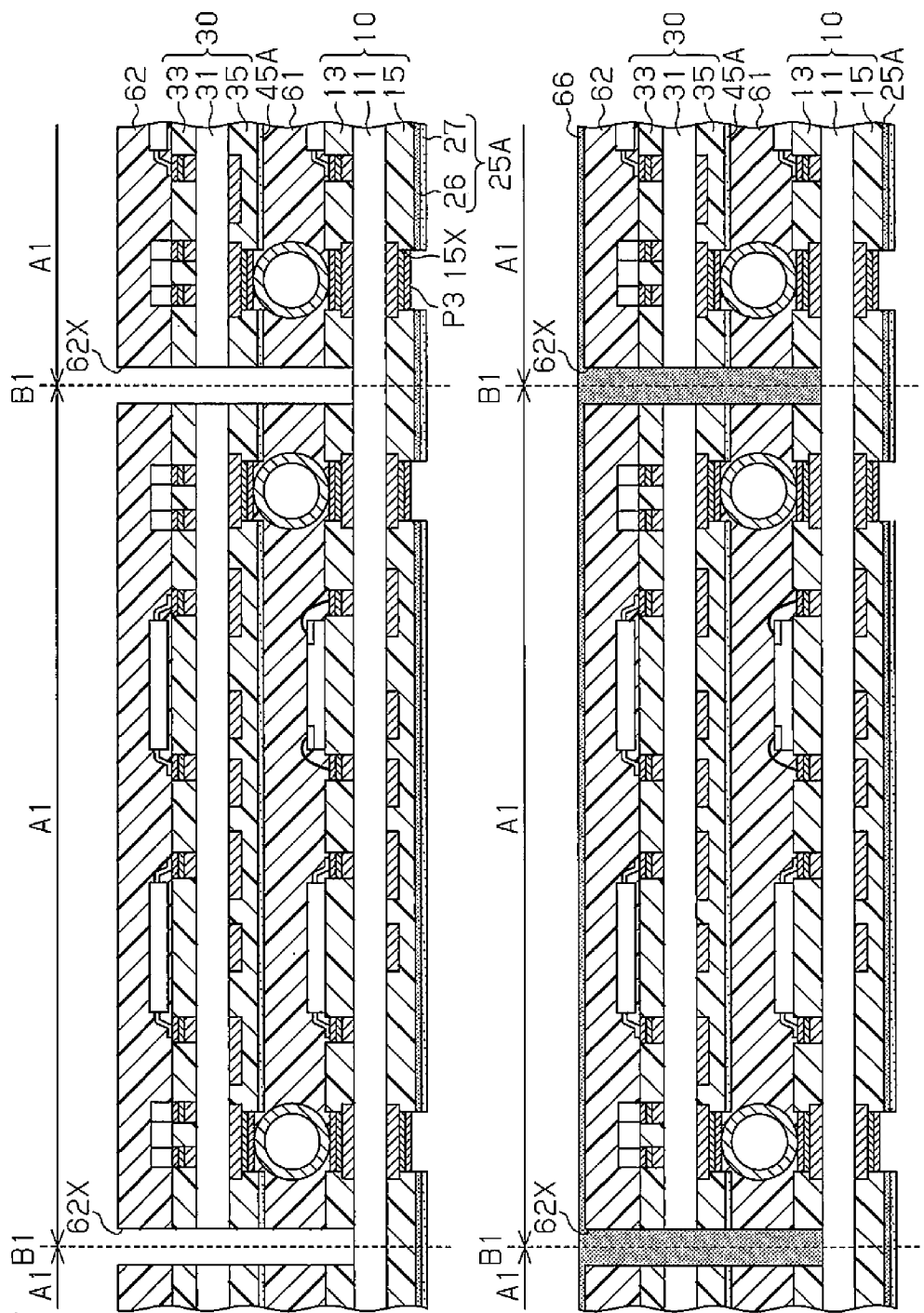
FIGS. 12A and 12B are schematic cross-sectional views illustrating a method for manufacturing the electronic device of the second embodiment.

First, by performing the manufacturing steps illustrated in FIGS. 3 to 6A are performed to manufacture the structure illustrated in FIG. 12A. This forms the groove 62X extending from the upper surface of the encapsulation resin 62 through the encapsulation resins 61 and 62, the solder resist layers 13, 33, and 35, the substrate main body 31, and the magnetic thin film 45A in the thicknesswise direction. However, in the step corresponding to FIG. 3B, the magnetic thin films 26 and 27 are sequentially stacked on the lower surface of the solder resist layer 15, and the magnetic thin film 45A is stacked on the lower surface of the solder resist layer 35. The magnetic thin films 26, 27, and 45A are formed, for example, by performing spin spraying.

In this case, preferably, after the magnetic thin film 26 is formed, plasma treatment is performed before the magnetic thin film 27 is formed. In this case, the plasma treatment generates a hydroxyl group on the surface of the magnetic thin film 26. The hydroxyl group is bonded to a metal ion, which is contained in the reaction solution used for spin spraying. Thus, by performing a plasma treatment, the adhesion of the magnetic thin films 26 and 27 may be improved.

In the step illustrated in FIG. 12B, the magnetic thin film 66 is formed to cover the upper and side surfaces of the encapsulation resin 62. For example, the magnetic thin film 66 is formed so that the magnetic thin film 66 entirely covers the upper surface of the encapsulation resin 62 and so that the groove 62X is filled with the magnetic thin film 66. The magnetic thin film 66 may be formed, for example, by performing spin spraying.

In the step illustrated in FIG. 13A, the structure illustrated in FIG. 12B is polished (half-cut) to an intermediate position in the thicknesswise direction to form a groove 66X along a cutting line B1 and the surrounding area. In a partial region of the groove 62X located in the cutting line B1 and the surrounding area, the present example forms a groove 66X extending through the magnetic thin film 66, with which the groove 62X is filled, in the thicknesswise direction. The groove 66X may be formed, for example, using a dicing blade or a slicer.

In the step illustrated in FIG. 13B, the magnetic thin film 67 is formed to cover the upper and side surfaces of the magnetic thin film 66. For example, the magnetic thin film 67 is formed so that the magnetic thin film 67 entirely covers the upper surface of the magnetic thin film 66 and so that the groove 66X is filled with the magnetic thin film 67. The magnetic thin film 67 is formed, for example, by performing spin spraying. Before the magnetic thin film 67 is formed, a plasma treatment may be performed on the magnetic thin film 66. Then, the magnetic thin film 67 is formed. In this case, the plasma treatment generates a hydroxyl group on the surface of the magnetic thin film 66. Then, the hydroxyl group is bonded to a metal ion, which is contained in the reaction solution used for spin spraying. Thus, by performing plasma treatment, the adhesion of the magnetic thin films 66 and 67 may be improved.

The above manufacturing steps manufacture the structure corresponding to the electronic device 1A in each region A1.

Figure 14:
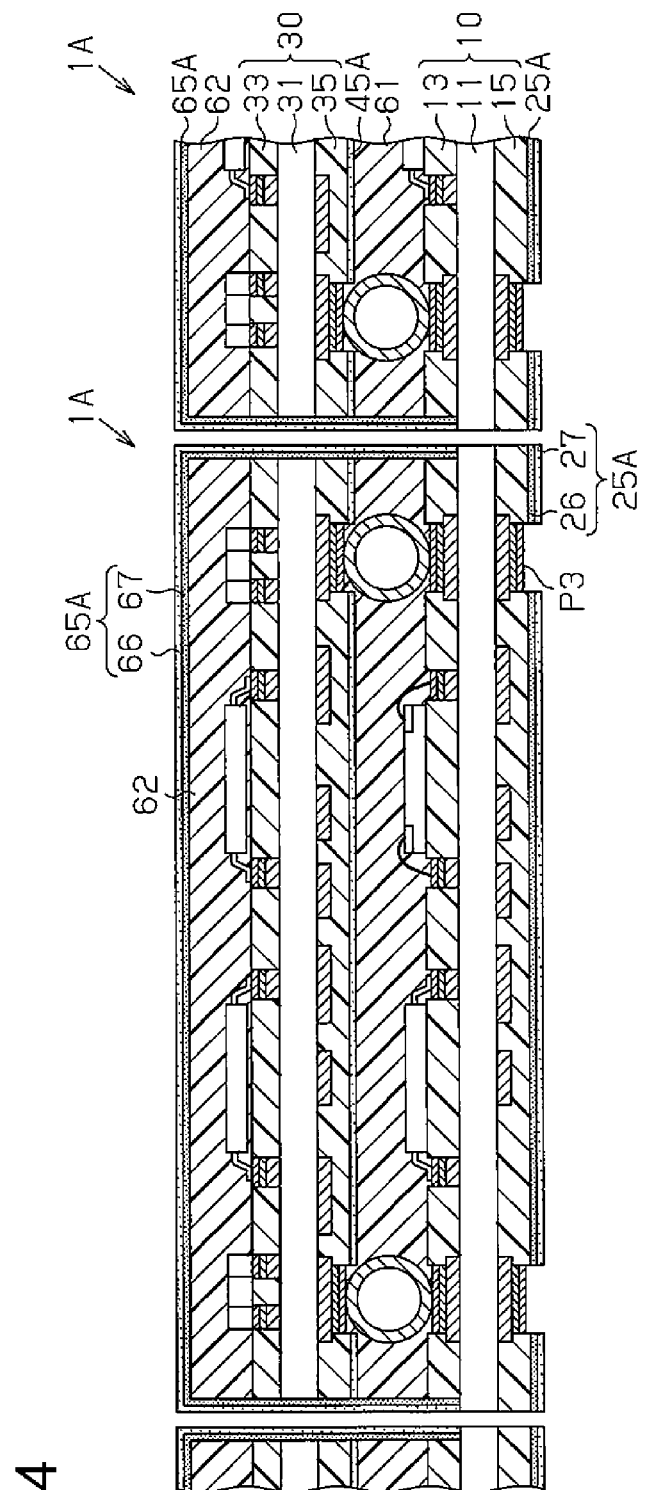
FIG. 14 is a schematic cross-sectional view illustrating the method for manufacturing the electronic device of the second embodiment.

In the step illustrated in FIG. 14, the structure illustrated in FIG. 13B is cut along the cutting line B1 with a dicing blade. This produces individual pieces of the electronic device 1A. More specifically, by cutting the magnetic thin film 67, the substrate main body 11, the solder resist layer 15, and the magnetic thin film 25A (magnetic thin films 26 and 27) along the cutting line B1, the individual pieces of the electronic device 1A are produced. The manufacturing processes described above manufactures a batch of the electronic devices 1A. In this step, the outer side surfaces of the magnetic thin film 67 are formed to be substantially flush with the outer side surfaces of the substrate main body 11, the solder resist layer 15, and the magnetic thin film 25A (magnetic thin films 26 and 27).

The embodiment described above has the following advantage in addition to advantages (1) to (6) of the first embodiment.

(7) The magnetic thin films 66 and 67 (magnetic thin films 26 and 27), which have different compositions, are stacked on the outermost surface of the electronic device 1A. That is, the magnetic thin films 66 and 67 (magnetic thin films 26 and 27), which have different resonance frequencies, are stacked on the outermost surface of the electronic device 1A. Therefore, the magnetic thin films 66 and 67 (magnetic thin films 26 and 27) suppress permeation of electromagnetic waves (noise) over a wide frequency band range. That is, the magnetic thin films 66 and 67 (magnetic thin films 26 and 27) suppress high frequency noise and low frequency noise. Therefore, even when the electronic device 1A is located near a source that generates low frequency noise, the amount of the external low frequency noise, which enters the electronic device 1A, may be drastically decreased.

It should be apparent to those skilled in the art that the present invention may be embodied in many other specific forms without departing from the scope of the invention. Particularly, it should be understood that the present invention may be embodied in the following forms.

In the above embodiments, the magnetic thin films 65 and 65A entirely cover the outer side surfaces of the encapsulation resin 62, the solder resist layer 33, the substrate main body 31, the solder resist layer 35, the magnetic thin films 45 and 45A, the encapsulation resin 61, and the solder resist layer 13. However, the formation regions of the magnetic thin film 65 and 65A, which serve as the outer side surface of the electronic devices 1 and 1A, are not particularly limited.

Figure 15:
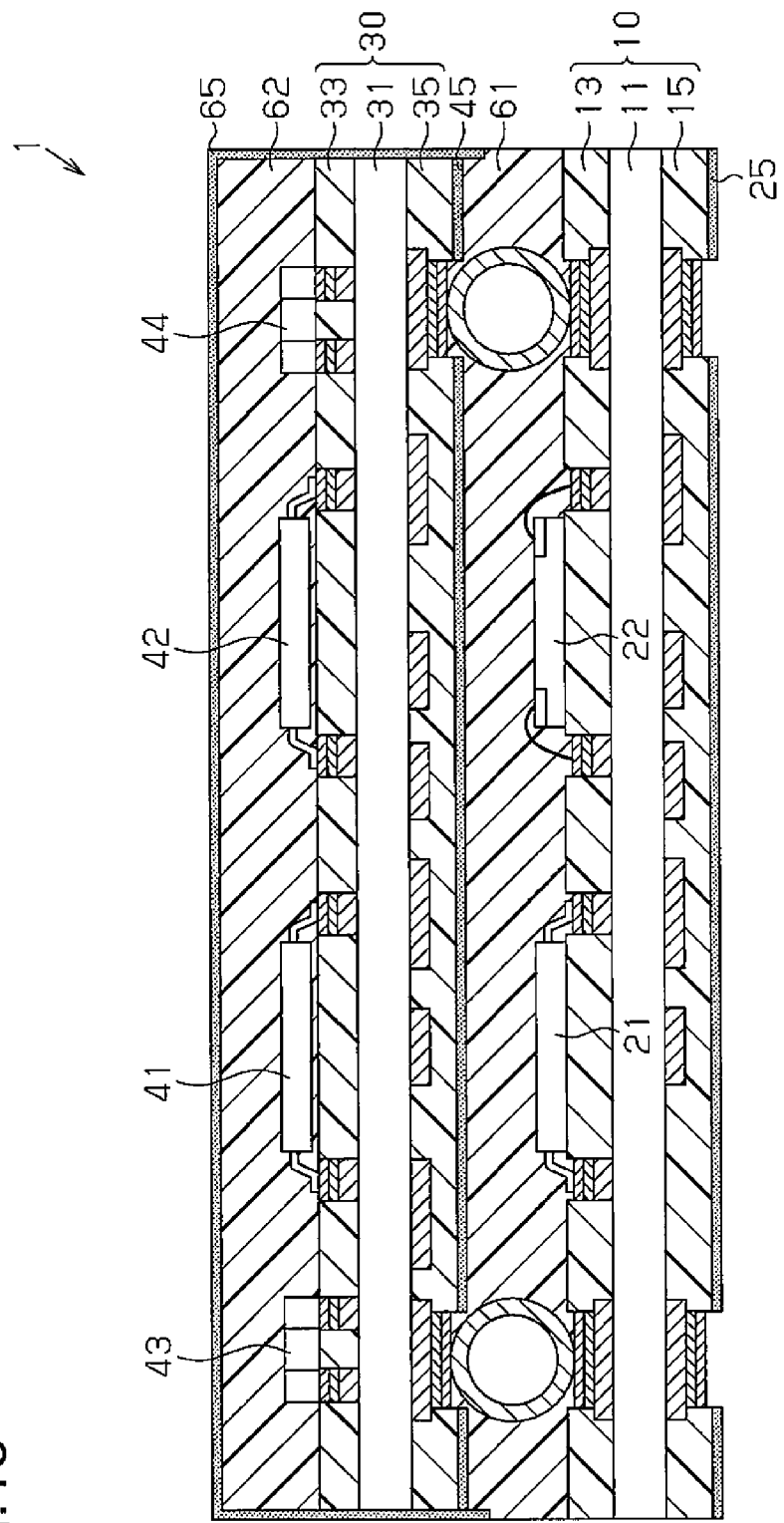
FIG. 15 is a schematic cross-sectional view illustrating an electronic device of a modified example.

For example, as illustrated in FIG. 15, the magnetic thin film 65 may entirely cover the outer side surfaces of the encapsulation resin 62, the solder resist layer 33, the substrate main body 31, the solder resist layer 35, and the magnetic thin film 45 and cover a portion of the outer side surface of the encapsulation resin 61. Each of the magnetic thin films 65 and 65A may partially cover the outer side surfaces of the encapsulation resin 62. Alternatively, each of the magnetic thin films 65 and 65A may partially cover only the entire upper surface of the encapsulation resin 62. This externally exposes the outer side surfaces of the encapsulation resin 62, the solder resist layer 33, the substrate main body 31, the solder resist layer 35, the magnetic thin films 45 and 45A, the encapsulation resin 61, the solder resist layer 13, the substrate main body 11, the solder resist layer 15, and the magnetic thin films 25 and 25A.

Figure 16:
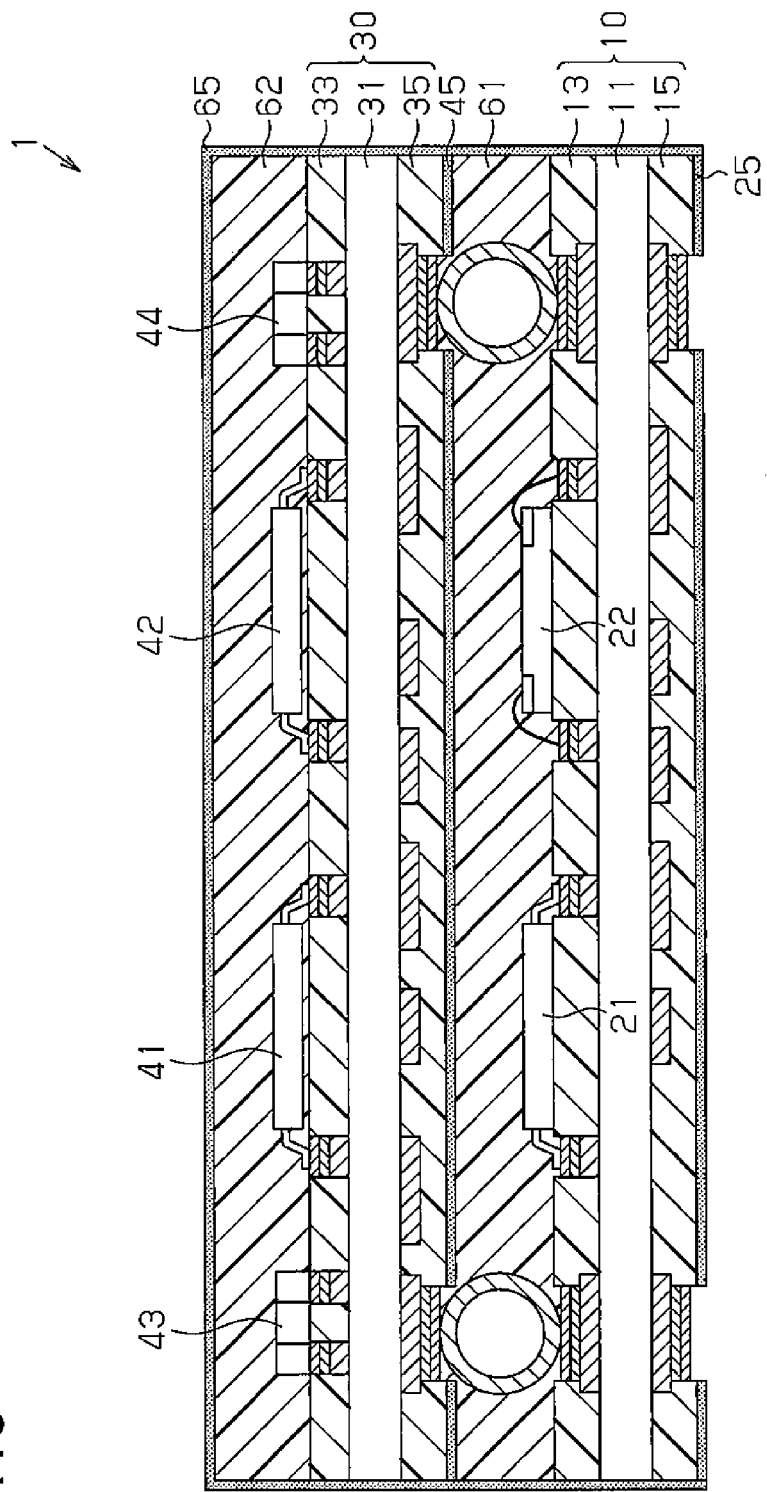
FIG. 16 is a schematic cross-sectional view illustrating an electronic device of a modified example.

Alternatively, as illustrated in FIG. 16, the magnetic thin film 65 may entirely cover the outer side surfaces of the encapsulation resin 62, the solder resist layer 33, the substrate main body 31, the solder resist layer 35, the magnetic thin films 45 and 45A, the encapsulation resin 61, the solder resist layer 13, the substrate main body 11, the solder resist layer 15, and the magnetic thin films 25 and 25A.

In the second embodiment, the magnetic thin film 67 entirely covers the outer side surface of the magnetic thin film 66. However, there is no limit to such a configuration. For example, the magnetic thin film 67 may partially cover the outer side surfaces of the magnetic thin film 66. For example, the magnetic thin film 67 may entirely cover the outer side surfaces of the magnetic thin film 66 and cover at least a portion of the outer side surface of the substrate main body 11, which is exposed from the magnetic thin film 66.

In the second embodiment, an insulation film, which has satisfactory adhesion relative to the magnetic thin films 26 and 27, may be located between the magnetic thin films 26 and 27.

In the second embodiment, an insulation film, which has satisfactory adhesion relative to the magnetic thin films 66 and 67, may be located between the magnetic thin films 66 and 67.

In the second embodiment, the stacking order of the magnetic thin films 26 and 27 and the magnetic thin films 66 and 67 is not particularly limited. For example, the magnetic thin film 27 may be formed to entirely cover the lower surface of the solder resist layer 15. Then, the magnetic thin film 26 is formed to entirely cover the lower surface of the magnetic thin film 27.

In the second embodiment, the number of layers of the magnetic thin films 25A and 65A is not particularly limited. For example, the embodiment may include the magnetic thin films 25A and 65A, each of which has a structure of stacking three or more layers of the magnetic thin film.

In the same manner as the magnetic thin films 25A and 65A, the magnetic thin films 45 and 45A of the above embodiments may be modified to have a structure obtained by stacking a plurality of layers of the magnetic thin film.

In the above embodiments, the number and type of electronic components, which are mounted on the wiring substrates 10 and 30, are not particularly limited. Also, there is no particular limitation for the mounting method of the electronic components.

In the above embodiments, the solder resist layers 13 and 33 may be omitted.

In the above embodiments, the solder resist layer 15 may be omitted. In this case, the magnetic thin films 25 and 25A are formed on the lower surface side of the wiring substrate 10. For example, an encapsulation resin may be formed on the lower surface of the substrate main body 11. Then, the magnetic thin films 25 and 25A are formed on the lower surface of the encapsulation resin.

In the above embodiments, the magnetic thin films 25 and 25A may be omitted.

In the above embodiments, the encapsulation resin 61 may be omitted.

In the above embodiments, the surfaces of the mount pads P1 and P4, the connection pads P2 and P5, and the external connection pad P3 are not limited to a circular shape. For example, these elements may have a polygonal shape, such as a tetragon or a pentagon, a semicircular shape, or an elliptical shape.

In the above embodiments, the copper core ball 51 is used as a conductive core ball in the solder ball 50. However, there is no limit to such a configuration. In lieu of the copper core ball 51, for example, a conductive core ball formed from a metal other than copper, such as gold or nickel, or a resin core ball formed from resin may be used. Alternatively, in lieu of the solder ball 50, a solder ball that does not include a conductive core ball or a resin core ball may be used.

In the above embodiments, the solder ball 50 is used as the connection terminal, which connects the semiconductor package 2 (wiring substrate 10) to the semiconductor package 3 (wiring substrate 30). However, there is no limit to such a configuration. For example, a metal post, which is a rod-shaped connection terminal, or a connection terminal, which has spring-like properties, (spring connection terminal) may be used as the connection terminal.

The above embodiments include the electronic devices 1 and 1A, each of which has a structure that stacks the two semiconductor packages 2 and 3 (wiring substrates 10 and 30) with the connection member (solder ball 50) located in between. However, there is no limit to such a configuration. For example, the embodiment may include an electronic device that has a structure stacking three or more semiconductor packages with connection members arranged in between.

The present examples and embodiments are to be considered as illustrative and not restrictive, and the invention is not to be limited to the details given herein, but may be modified within the scope and equivalence of the appended claims.

CLAUSES

This disclosure further encompasses various embodiments described below.

1. A method for manufacturing an electronic device comprising:

preparing a plurality of wiring substrates to form a structure that corresponds to the electronic device;

forming a magnetic thin film on a lower surface of a solder resist layer that serves as a lowermost layer of each of the wiring substrates;

mounting an electronic component on each of the wiring substrates;

forming a first encapsulation resin that covers an upper surface of one of the wiring substrates;

stacking the wiring substrates upon one another with a connection member arranged between adjacent ones of the wiring substrates so that the wiring substrate, on which the first encapsulation resin is formed, is located at the uppermost side;

forming a second encapsulation resin so that a gap between the adjacent ones of the wiring substrates is filled with the second encapsulation resin;

forming a groove at a predetermined location of the structure, from an upper side of the first encapsulation resin, which includes the stacked wiring substrates, the magnetic thin film, the first encapsulation resin, and the second encapsulation resin;

forming a second magnetic thin film that entirely covers an upper surface of the first encapsulation resin, wherein the groove is filled with the second magnetic thin film; and cutting the second magnetic thin film and the wiring substrates at the predetermined location to obtain the structure, which corresponds to the electronic device.

2. A method for manufacturing an electronic device comprising:

preparing a plurality of wiring substrates to form a structure that corresponds to the electronic device;

forming a magnetic thin film on a lower surface of a solder resist layer, which is formed as a lowermost layer of each of the wiring substrates;

stacking the wiring substrates upon one another with a connection member arranged between adjacent ones of the wiring substrates;

mounting an electronic component on an upper surface of the uppermost one of the wiring substrates;

forming a first encapsulation resin that encapsulates the electronic component on the upper surface of the uppermost one of the wiring substrates;

forming a groove at a predetermined location of the structure including the stacked wiring substrates, the magnetic thin film, and the first encapsulation resin, from an upper side of the first encapsulation resin;

forming a second magnetic thin film that entirely covers an upper surface of the first encapsulation resin, wherein the groove is filled with the second magnetic thin film; and cutting the second magnetic thin film and the wiring substrates at the predetermined location to obtain the structure, which corresponds to the electronic device.

The invention claimed is:

1. An electronic device comprising:
   a plurality of wiring substrates stacked upon one another with a connection member arranged between adjacent ones of the wiring substrates, wherein the connection member electrically connects the adjacent ones of the wiring substrates, and each of the wiring substrates includes a solder resist layer as a lowermost layer;
   a plurality of electronic components mounted on the wiring substrates so that at least one of the electronic components is mounted on each of the wiring substrates;
   a first magnetic thin film that covers a lower surface of the solder resist layer of an upper one of the adjacent ones of the wiring substrates;
   a first encapsulation resin formed on an upper surface of the uppermost one of the wiring substrates, wherein the first encapsulation resin encapsulates the electronic component mounted on the uppermost one of the wiring substrates; and
   a second magnetic thin film that entirely covers an upper surface of the first encapsulation resin and covers a lower surface of the solder resist layer on the lowermost one of the wiring substrates,
   wherein:
   the solder resist layer of the upper wiring substrate includes an opening that extends through the solder resist layer at a location corresponding to the connection member;
   the first magnetic thin film includes an opening that extends through the first magnetic thin film at a location corresponding to the connection member and the opening of the solder resist layer;
   the upper wiring substrate includes a connection pad that is located in the opening of the solder resist layer, has a surface-processed layer, and is connected to the connection member;
   the connection pad is exposed to the outside through the opening of the solder resist layer and the opening of the first magnetic thin film; and
   the first magnetic thin film entirely covers the solder resist layer of the upper wiring substrate.

2. The electronic device according to claim 1, wherein the first magnetic thin film and the second magnetic thin film have different compositions.

3. The electronic device according to claim 1, wherein the first magnetic thin film has a composition set so that an imaginary number of a complex magnetic permeability of the first magnetic thin film includes frequency characteristics corresponding to the electronic component that is mounted on a lower one of the adjacent ones of the wiring substrates.

4. The electronic device according to claim 1, wherein
   the electronic components include an electronic component that emits low frequency noise and is mounted on a predetermined one of the wiring substrates,
   when the first magnetic thin film is formed on the upper one of the adjacent ones of the wiring substrates stacked directly above the predetermined one of the wiring substrates, the first magnetic thin film is formed from a magnetic material containing manganese and zinc, and
   the second magnetic thin film is formed from a magnetic material containing nickel and zinc.

5. The electronic device according to claim 1, wherein
   the second magnetic thin film includes a third magnetic thin film, which covers the upper surface of the first encapsulation resin, and a fourth magnetic thin film, which covers an upper surface of the third magnetic thin film,
   the third magnetic thin film and the fourth magnetic thin film have different compositions, and
   the third magnetic thin film has a greater resistivity than the fourth magnetic thin film.

6. The electronic device according to claim 1, wherein
   the second magnetic thin film covers at least a portion of an outer side surface of the first encapsulation resin, and
   an outer side surface of the second magnetic thin film is flush with an outer side surface of the solder resist layer of the lowermost one of the wiring substrates.

7. The electronic device according to claim 1, further comprising a second encapsulation resin, which is formed between the adjacent ones of the wiring substrates.

8. The electronic device according to claim 7, wherein the second magnetic thin film covers outer side surfaces of the first encapsulation resin, the second encapsulation resin, and the wiring substrates.

* * * * *

UNITED STATES PATENT AND TRADEMARK OFFICE
CERTIFICATE OF CORRECTION

PATENT NO. : 9,456,504 B2  
APPLICATION NO. : 14/547498  
DATED : September 27, 2016  
INVENTOR(S) : Tomoki Kobayashi Page 1 of 1

It is certified that error appears in the above-identified patent and that said Letters Patent is hereby corrected as shown below:

On the title page item 56 col. 2, line 1, delete "defintion" and insert -- definition --, therefor.

Signed and Sealed this  
Eighth Day of November, 2016

Michelle K. Lee  
*Director of the United States Patent and Trademark Office*